United States Patent
Takahashi

(10) Patent No.: US 8,405,999 B2
(45) Date of Patent: Mar. 26, 2013

(54) FLEXIBLE WIRING BOARD AND METHOD OF MANUFACTURING SAME

(75) Inventor: Michimasa Takahashi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 476 days.

(21) Appl. No.: 12/401,141

(22) Filed: Mar. 10, 2009

(65) Prior Publication Data
US 2009/0229876 A1   Sep. 17, 2009

Related U.S. Application Data

(60) Provisional application No. 61/035,169, filed on Mar. 10, 2008.

(51) Int. Cl.
H05K 1/00 (2006.01)

(52) U.S. Cl. ........ 361/749; 361/750; 361/756; 361/751; 174/262; 174/263; 174/264

(58) Field of Classification Search .................. 361/749, 361/750, 756, 751
See application file for complete search history.

(56) References Cited

U.S. PATENT DOCUMENTS

| | | | |
|---|---|---|---|
| 3,471,348 A | 10/1969 | Shaheen et al. | |
| 4,099,038 A * | 7/1978 | Purdy | 200/61.08 |
| 4,687,695 A | 8/1987 | Hamby | |
| 4,715,928 A | 12/1987 | Hamby | |
| 5,121,297 A | 6/1992 | Haas | |
| 5,799,392 A | 9/1998 | Mishiro | |
| 5,854,534 A * | 12/1998 | Beilin et al. | 257/691 |
| 6,384,339 B1 * | 5/2002 | Neuman | 174/254 |
| 7,210,942 B2 | 5/2007 | Uchida et al. | |
| 7,258,549 B2 | 8/2007 | Asahi et al. | |
| 7,291,795 B2 | 11/2007 | Maharshak et al. | |
| 7,338,290 B2 | 3/2008 | Motohashi et al. | |
| 7,415,761 B2 | 8/2008 | Hirose et al. | |
| 7,423,219 B2 | 9/2008 | Kawaguchi et al. | |
| 7,601,919 B2 | 10/2009 | Phan et al. | |
| 7,759,582 B2 | 7/2010 | Takahashi et al. | |
| 7,982,135 B2 | 7/2011 | Takahashi et al. | |
| 8,035,983 B2 | 10/2011 | Takahashi et al. | |
| 8,071,883 B2 | 12/2011 | Takahashi et al. | |
| 8,238,109 B2 | 8/2012 | Sagisaka | |
| 2001/0010303 A1 | 8/2001 | Caron et al. | |
| 2005/0217895 A1 * | 10/2005 | Maharshak et al. | 174/262 |
| 2005/0243528 A1 | 11/2005 | Murayama | |
| 2006/0169485 A1 | 8/2006 | Kawaguchi et al. | |
| 2006/0281343 A1 | 12/2006 | Uchida et al. | |
| 2007/0012475 A1 * | 1/2007 | Kawaguchi et al. | 174/255 |
| 2007/0126123 A1 * | 6/2007 | Sawachi | 257/777 |

(Continued)

FOREIGN PATENT DOCUMENTS

CN    1 806 474 A    7/2006
DE    42 08 610 C1    5/1993

(Continued)

*Primary Examiner* — Tuan T Dinh
*Assistant Examiner* — Steven Sawyer
(74) *Attorney, Agent, or Firm* — Oblon, Spivak, McClelland, Maier & Neustadt, L.L.P.

(57) ABSTRACT

A flexible wiring board includes a first flexible base material with a conductor pattern formed thereon, a second flexible base material disposed adjacent to the first flexible base material and an insulating layer covering the first flexible base material and the second flexible base material. The insulating layer exposes at least one portion of the first flexible base material. A conductor pattern is formed on the insulating layer, and a plating layer is provided connecting the conductor pattern of the first flexible base material and the conductor pattern on the insulating layer.

25 Claims, 18 Drawing Sheets

U.S. PATENT DOCUMENTS

| | | |
|---|---|---|
| 2007/0281505 A1 * | 12/2007 | Kobayashi et al. ............ 439/69 |
| 2008/0014768 A1 | 1/2008 | Lee et al. |
| 2008/0093118 A1 | 4/2008 | Takahashi et al. |
| 2008/0099230 A1 | 5/2008 | Takahashi et al. |
| 2008/0168651 A1 | 7/2008 | Bhatt et al. |
| 2008/0289859 A1 | 11/2008 | Mikado et al. |
| 2009/0014205 A1 | 1/2009 | Kobayashi et al. |
| 2009/0229876 A1 | 9/2009 | Takahashi |

FOREIGN PATENT DOCUMENTS

| | | |
|---|---|---|
| EP | 1 566 993 A1 | 8/2005 |
| JP | 63-293991 | 11/1988 |
| JP | 03-246986 | 11/1991 |
| JP | 05-090756 | 4/1993 |
| JP | 06-216537 | 8/1994 |
| JP | 07-094835 | 4/1995 |
| JP | 2003-152309 | 5/2003 |
| JP | 05-315758 | 11/2003 |
| JP | 2005-311244 | 11/2005 |
| JP | 2005-322878 | 11/2005 |
| JP | 2006-073819 | 3/2006 |
| JP | 2006-100703 | 4/2006 |
| JP | 2006-100704 | 4/2006 |
| JP | 2006-128360 | 5/2006 |
| JP | 2006-140213 | 6/2006 |
| JP | 2006-196800 | 7/2006 |
| JP | 2006-294666 | 10/2006 |
| JP | 2007-273654 | 10/2007 |
| JP | 4021472 B1 | 10/2007 |
| JP | 4024846 B1 | 10/2007 |
| JP | 2008-34511 | 2/2008 |
| TW | 478306 B | 3/2002 |
| WO | WO 93/11652 | 6/1993 |
| WO | WO 2004/093508 A1 | 10/2004 |
| WO | WO 2004/098252 A1 | 11/2004 |

* cited by examiner

FLEXIBLE WIRING BOARD AND METHOD OF MANUFACTURING SAME

CROSS-REFERENCE TO RELATED APPLICATIONS

The present application claims the benefit of U.S. Provisional Application No. 61/035,169, filed Mar. 10, 2008. The contents of that application are incorporated herein by reference in their entirety.

BACKGROUND OF THE INVENTION

1. Technical Field

The present invention relates to a bendable flexible wiring board and its manufacturing method.

2. Discussion of Related Art

Japanese Laid-Open Patent Application 2005-322878, Japanese Laid-Open Patent Application 2006-128360 and Japanese Laid-Open Patent Application 2005-311244 disclose wiring boards having a rigid part and a flexible part. The entire content of each of these publications is incorporated herein by reference. Despite the technologies in these publications, there remains a demand for a flexible wiring board which offers higher reliability, especially higher connection reliability, and which is also easy to manufacture at low cost.

BRIEF SUMMARY OF EMBODIMENTS OF THE INVENTION

One aspect of the invention includes a flexible wiring board having a first flexible base material with a conductor pattern formed thereon, a second flexible base material disposed adjacent to the first flexible base material and an insulating layer covering the first flexible base material and the second flexible base material. The insulating layer exposes at least one portion of the first flexible base material. A conductor pattern is formed on the insulating layer, and a plating layer is provided connecting the conductor pattern of the first flexible base material and the conductor pattern on the insulating layer.

Another aspect of the invention includes a flexible wiring board having a first flexible base material with a conductor pattern formed thereon, a second flexible base material disposed adjacent to the first flexible base material and an insulating layer covering the first flexible base material and the second flexible base material. The insulating layer exposes at least one portion of the first flexible base material. A conductor pattern is formed on the insulating layer, and a via is formed in the insulating layer and connecting the conductor pattern of the first flexible base material and the conductor pattern on the insulating layer. The first flexible base material further includes a protective layer covering the conductor pattern of the first flexible base material, and the via formed in the insulating layer includes a plating layer.

Still another aspect includes a method of manufacturing a flexible wiring board. The method includes disposing a first flexible base material having a conductive pattern thereon and a second flexible base material adjacent to each other. A boundary between the first flexible base material and the second flexible base material is covered with an insulation layer, and a conductor pattern is provided on the insulating layer. A via is formed that penetrates the insulation layer and reaches the conductive pattern in the second flexible base material, and the via hole opening is plated to form a via connecting the conductor pattern of the first flexible base material and the conductor pattern on the insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. (1A) and (1B) are a side view and a plan view of a flexible wiring board according to an example of the present invention.

Figure 1A:
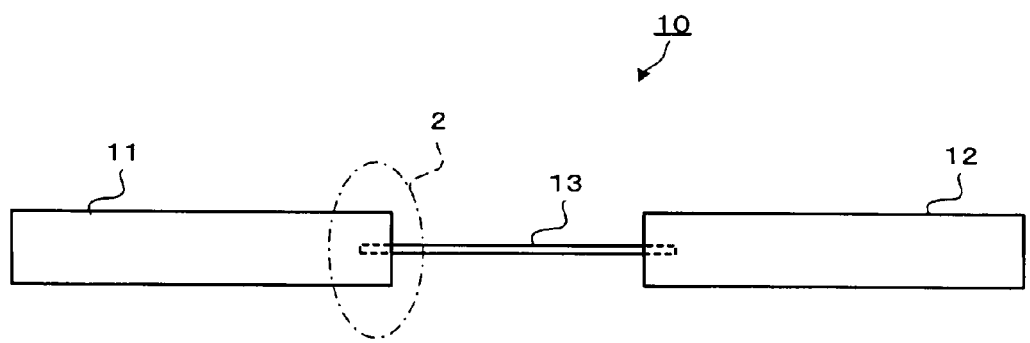
Figure 1B:
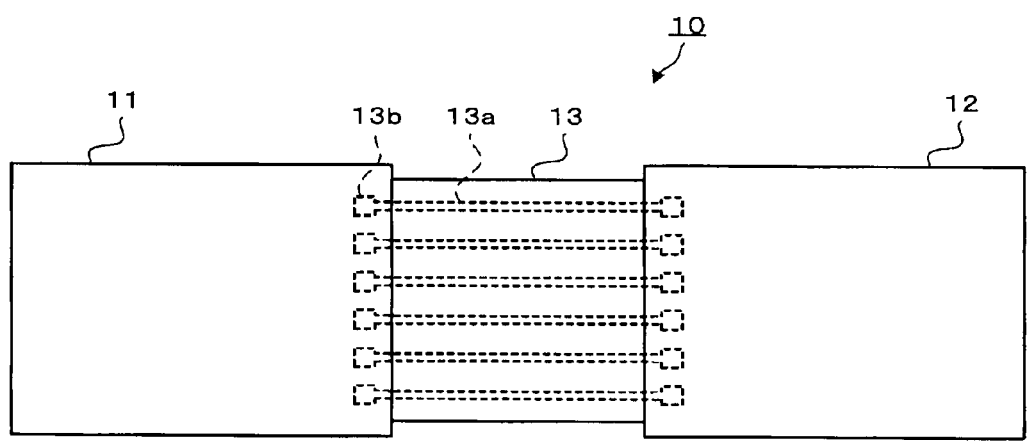
Figure 2:
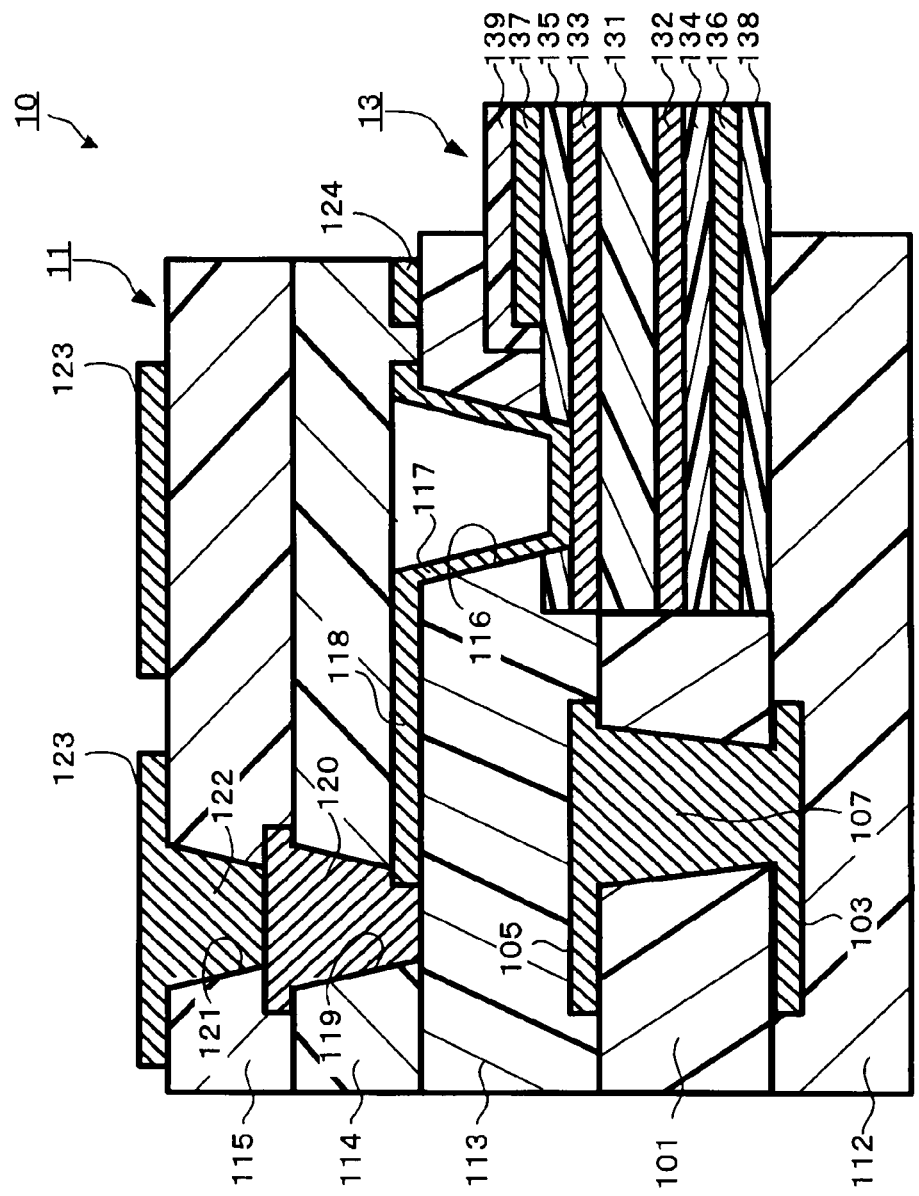

FIG. (2) is a partially enlarged view of FIG. (1A).

FIG. (3) is a modified example of the flexible wiring board shown in FIG. (2).

FIGS. (4A-4C) are views illustrating the steps of manufacturing a flexible substrate.

FIGS. (5A-5D) are views illustrating the steps of a method to manufacture a second flexible base material.

FIGS. (6A-6N) are views illustrating the steps of a method to manufacture a flexible wiring board.

FIG. (7) is a partially enlarged view of FIG. (6C).

FIG. (8) is a modified example of the flexible wiring board shown in FIG. (3).

FIG. (9) is a view illustrating an example in which the wiring pattern is fanned out.

FIGS. (10, 11) are views illustrating examples in which part of a flexible substrate is formed wider than the rest to increase its strength.

FIG. (12) is a modified example of the flexible wiring board shown in FIG. (3).

FIGS. (13A-13N) are views illustrating a modified example of the steps of a method to manufacture a flexible wiring board.

FIGS. (14A-14E) are views illustrating another modified example of the steps of a method to manufacture a flexible wiring board.

DETAILED DESCRIPTION OF EMBODIMENTS

As noted above, there remains a demand for a flexible wiring board which offers higher reliability, especially higher connection reliability, and which is also easy to manufacture at low cost. The embodiments will now be described with reference to the accompanying drawings, wherein like reference numerals may designate corresponding or identical elements throughout the various drawings.

In the following, flexible wiring board (10) according to an example of the present invention is described. Flexible wiring board (10) according to the present embodiment is, as shown in FIGS. (1A) and (1B), structured with first multilayer substrate (11), second multilayer substrate (12) and flexible substrate (13) connecting the first and second multilayer substrates (11, 12). First and second multilayer substrates (11, 12) are flexible and may be bent to a certain degree. In first and second multilayer substrates (11, 12), any circuit patterns are formed to which, according to requirements, electronic components such as a semiconductor chip or the like are connected.

Flexible substrate (13) is flexible and may be bent at any point. In flexible substrate (13), striped wiring (13a) is formed to connect the circuit patterns on first multilayer substrate (11) and second multilayer substrate (12). At both ends of wiring (13a), connection pads (13b) are placed. To connection pads (13b), land portions of the circuit patterns on multilayer substrates (11, 12) are connected. The circuit patterns on first and second multilayer substrates (11, 12) are connected to each other by means of wiring (13a).

Next, the structures of multilayer substrates (11, 12), flexible substrate (13) and their joint sections are described with reference to FIG. (2), taking as an example the joint section between first multilayer substrate (11) and flexible substrate (13). FIG. (2) is an enlarged cross-sectional view of the area indicated as "2" in FIG. (1A).

As shown in FIG. (2), flexible substrate (13) is formed by laminating first flexible base material (131), conductive layers (132, 133), insulation layers (134, 135), shield layers (136, 137) and coverlays, or protective coating (138, 139). First flexible base material (131) is formed with an insulative (i.e., insulating) flexible sheet, for example, a polyimide sheet, polyester sheet, liquid crystal polymer sheet or polyether-ether-ketone sheet, with a thickness in the range of 20-50 μm, preferably with a thickness of approximately 30 μm. Conductive layers (132, 133) are formed respectively on the top and bottom surfaces of first flexible base material (131), structuring striped wiring (13a) as shown in FIG. (1B). Conductive layers (132, 133) are formed, for example, from copper patterns with a thickness of approximately 5-15 μm.

Insulation layers (134, 135) are formed with an approximately 5-15 μm-thick insulative film such as polyimide film, polyester film, liquid-crystal polymer film or polyether-ether film, which insulate conductive layers (132, 133) from the outside. Shield layers (136, 137) are formed with conductive layers, for example, cured silver-paste films, and they shield conductive layers (132, 133) from outside electromagnetic noise as well as shield electromagnetic noise from conductive layers (132, 133) to the outside. Coverlays (138, 139) are formed with, for example, an approximately 5-15 μm-thick insulative film such as polyimide, and they insulate the entire flexible substrate (13) from the outside and protect it as well.

On the other hand, first multilayer substrate (11) is formed by laminating second flexible base material (101), first and second insulation layers (112, 113) and first and second upper-layer insulation layers (114, 115). Second flexible base material (101) provides strength for multilayer substrate (11) and is formed with, for example, a material having excellent insulation and flexibility which costs less than polyimide, such as heat-resistant polyester or the like. Second flexible base material (101) is disposed horizontal to, but separated from, first flexible base material (131) of flexible substrate (13).

On both surfaces of second flexible base material (101), circuit patterns (103, 105) are formed. Circuit patterns (103, 105) are connected to each other according to requirements through filled vias (107) or the like that are filled with conductor such as copper. Furthermore, circuit patterns (103, 104) are connected to other circuits through vias or wiring not shown in the drawing.

First and second insulation layers (112, 113) are formed with insulative base material such as polyimide, polyester, liquid crystal polymer or polyether ether and are joined by an adhesive agent to flexible substrate (13) and second flexible base material (101). First and second insulation layers (112, 113) each have a thickness in the range of 50-100 μm, preferably approximately 50 μm. First and second insulation layers (112, 113) cover second flexible base material (101) and the tip of flexible substrate (13) on both the top and bottom surfaces, and expose part of flexible substrate (13).

Second flexible base material (101) and first and second insulation layers (112, 113) form the flexible core of multilayer substrate (11), and support and anchor flexible substrate (13) by sandwiching its tip. Furthermore, at a portion of second insulation layer (113) that faces connection pads (13b) of wiring (133) in flexible substrate (13), vias (via holes or contact holes) (116) are formed.

In flexible substrate (13), shield layer (137) and coverlay (139) are removed from the portion facing vias (116) (the portion where connection pads (13b) of wiring (13a) are formed). Vias (116) penetrate second insulation layer (113) and insulation layer (135) in flexible substrate (13), and expose connection pads (13b) of conductive layer (133). On the inner surface of via (116), conductive layer (117) made of plated copper or the like is formed. Conductive layers (117) are connected through plating to connection pads (13b) of conductive layer (133) in flexible substrate (13). Also, vias (116) have a conformal via structure.

On second insulation layer (113), extended pattern (118) connected to conductive layers (117) is formed. Extended pattern (118) is formed from a copper-plated layer or the like. Also, at an edge of second insulation layer (113), namely at the section positioned beyond the border between flexible substrate (13) and second flexible base material (101), copper pattern (124) insulated from the rest is disposed. Copper pattern (124) works as a radiation board. Thus, the heat generated in multilayer substrate (11) may be effectively radiated.

First upper-layer insulation layer (114) is laminated on second insulation layer (113). First upper-layer insulation layer (114) is formed with a flexible insulative film such as polyimide, polyester, liquid crystal polymer or polyether ether ketone, and is adhered to second insulation layer (113). Alternatively, first upper-layer insulation layer (114) may be formed by curing a prepreg made by impregnating resin in glass cloth or the like. However, because the prepreg itself is very thin, first upper-layer insulation layer (114) also has a certain degree of flexibility.

On first upper-layer insulation layer (114), second upper-layer insulation layer (115) is disposed. Second upper-layer insulation layer (115) is formed with a flexible insulative film such as polyimide, polyester, liquid crystal polymer or polyether ether ketone, and is adhered to second insulation layer (113). Alternatively, first upper-layer insulation layer (114) may be formed by curing a prepreg made by impregnating resin in glass cloth or the like.

In first upper-layer insulation layer (114), vias (first upper-layer vias) (119) connected to extended pattern (118) are formed. Vias (119) are filled with conductor (120) such as copper. Also, on second upper-layer insulation layer (115) laminated on first upper-layer insulation layer (114), vias (second upper-layer vias) (121) connected to vias (119) are formed. Vias (121) are filled with conductor (120) such as copper. Namely, filled built-up vias are formed with vias (119, 121).

On second upper-layer insulation layer (115), conductive pattern (circuit pattern) (123) is formed appropriately. Vias (119) are also connected appropriately to conductive pattern (123).

The structure of multilayer substrate (12), and that of the joint section between multilayer substrate (12) and flexible substrate (13) are the same as the structure of multilayer substrate (11) and that of the joint section between multilayer substrate (11) and flexible substrate (13).

In flexible wiring board (10) having the above structure, the tip of flexible substrate (13) is inserted between first and second insulation layer (112, 113) that form the core section of multilayer substrate (11). Furthermore, by means of conductive layers (copper-plated layers) (117) formed in vias (116) which are formed in second insulation layer (113) and insulation layer (135), connection pads (13b) of conductive layer (133) in flexible substrate (13) and conductive pattern (123) on multilayer substrate (11) are connected.

Therefore, the stress exerted on flexible substrate (13) when flexible substrate (13) is bent will not be conveyed to the joint section (vias 116, conductive layers 117) of multilayer substrate (11). Accordingly, stress exerted on the joint section between multilayer substrate (11) and flexible substrate (13) is lowered, and thus its reliability is high.

Also, conductive layer (133) in flexible substrate (13) and conductive layers (117) in vias (116) in multilayer substrate (11) are connected through plating. Thus, the reliability of the joint section is high.

Also, the edge surfaces of first and second insulation layers (112, 113) on the side of flexible substrate (13) protrude beyond the edge surface of upper-layer insulation layer (114) on the side of flexible substrate (13). Therefore, when flexible substrate (13) is bent, the stress exerted on flexible substrate (13) is seldom conveyed to the joint section of multilayer substrate (11) (vias 116, conductive layers 117). Accordingly, stress exerted on the joint section between multilayer substrate (11) and flexible substrate (13) is lowered, and thus its reliability is high.

Also, multilayer substrate (11) is formed in such a way that its core section holds the expansion/shrinkage of flexible substrate (13), which tends to expand/shrink easily, in a horizontal direction. Therefore, reliability against mechanical bending and heat-resistance reliability are high.

Also, since the section made of flexible base material in flexible substrate (13) is exposed between multilayer substrates (11, 12), stress exerted on wiring or the like when being bent is small in contrast to situations where the entire structure is covered with insulative resin or the like.

Also, flexible wiring board (10) is structured in such a way that first and second insulation layers (112, 113) of multilayer substrate (11) sandwich the tip of flexible substrate (13). Thus, a change in the size of flexible substrate (13) does not have a big impact, and the margin of error in aligning the connection land (via 116) of multilayer substrate (11) may be minimized. Accordingly, the diameter of vias (116) may be designed to be smaller.

Also, since second flexible base material (101) is formed with a material having high flexibility and high abrasion resistance, durability may be enhanced when flexible substrate (13) is bent.

Also, since second flexible base material (101) is formed with material having high heat resistance, it will not be damaged by heat during the reflow process to fuse solder. Accordingly, an electronic component may be mounted.

Also, by using expensive polyimide base material in parts and relatively inexpensive polyester base material in other parts as the base material for flexible wiring board (10), the manufacturing cost may be suppressed without lowering the level of performance.

Conductive layer (132), insulation layer (134), shield layer (136) and coverlay (138) may be removed from the structure of flexible substrate (13) shown in FIG. (2)

In the above example, to make understanding easier, conductive patterns were formed only on the top surfaces of multilayer substrates (11, 12). However, the present invention is not limited to such an example. For instance, as shown in FIG. 3, conductive patterns may also be formed on the bottom surfaces of multilayer substrates (11, 12).

Figure 3:
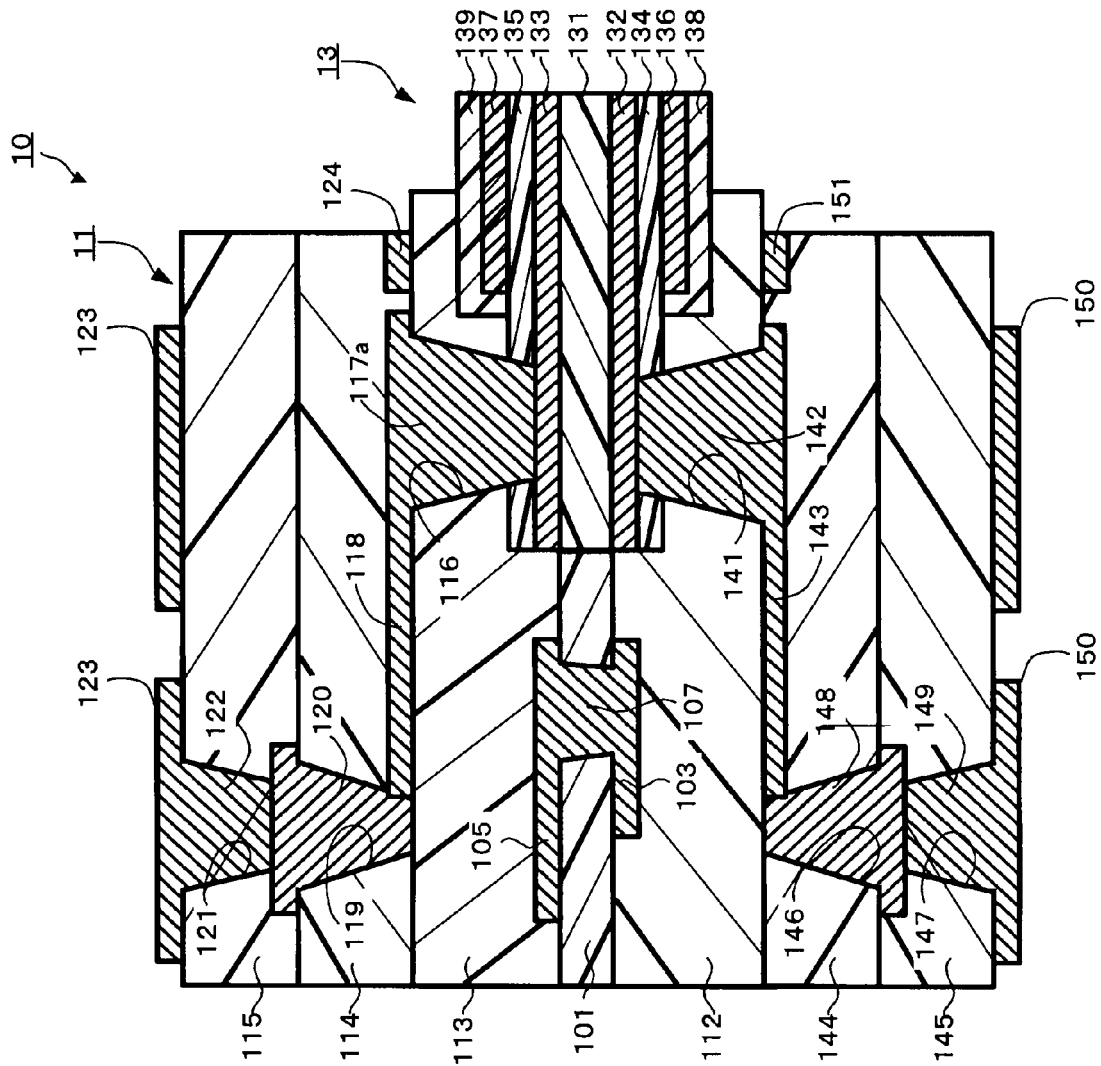
Figure 4A:
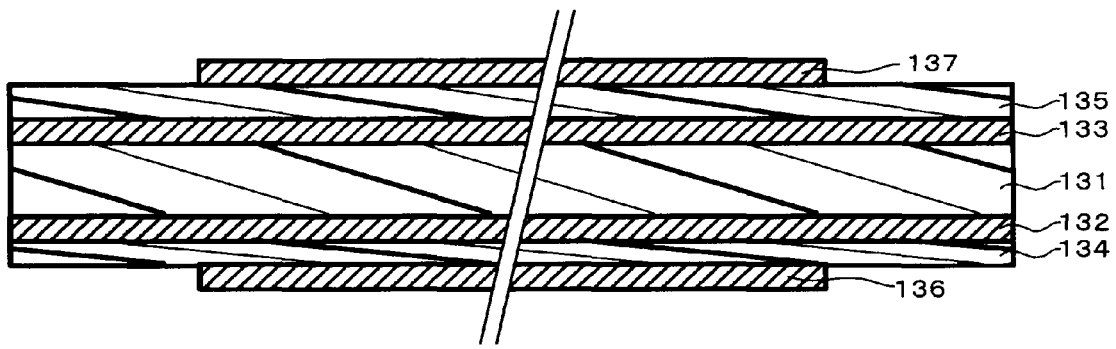
Figure 4B:
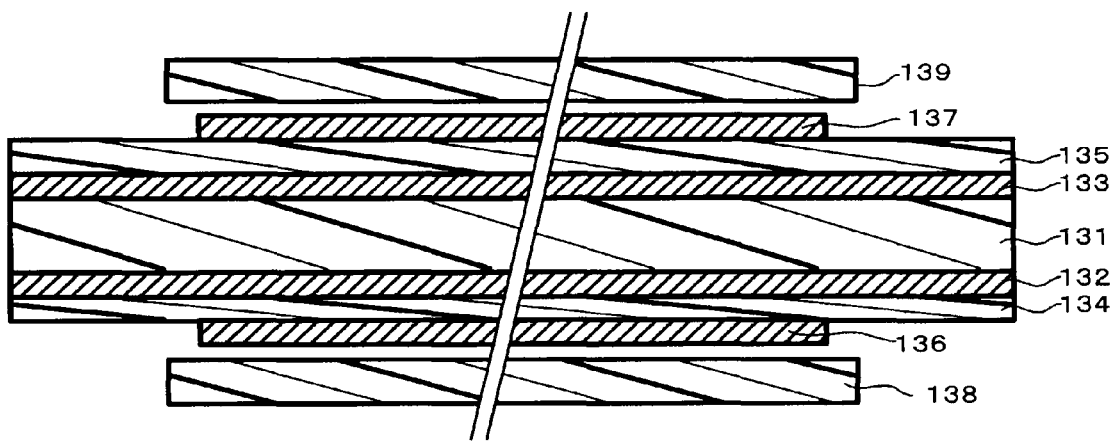
Figure 4C:
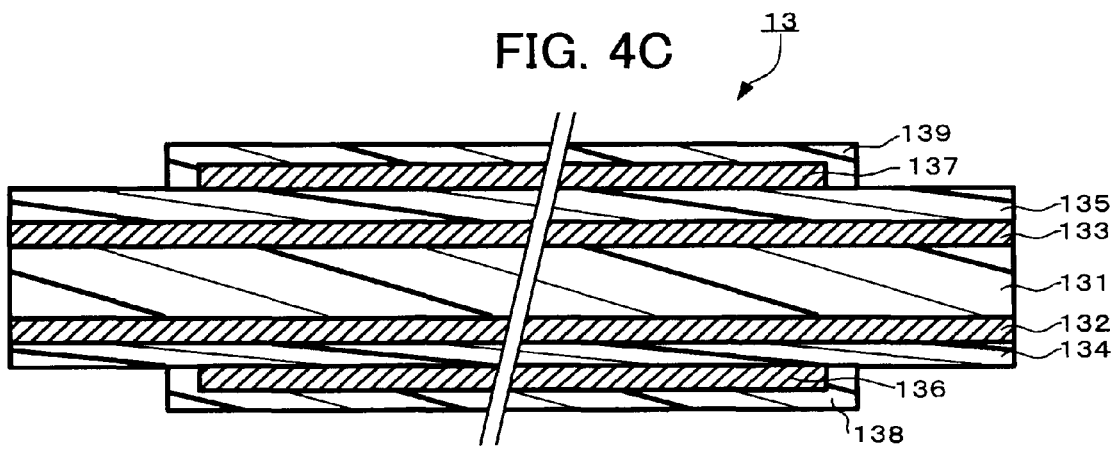
Figure 5A:
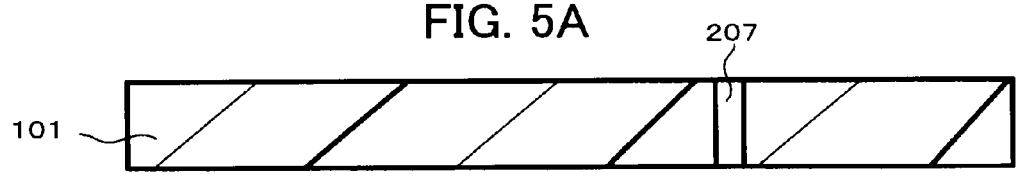
Figure 5B:
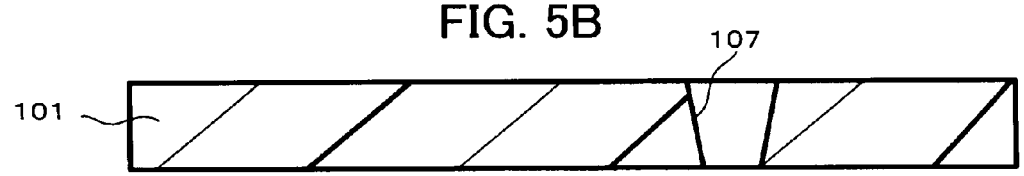
Figure 5C:
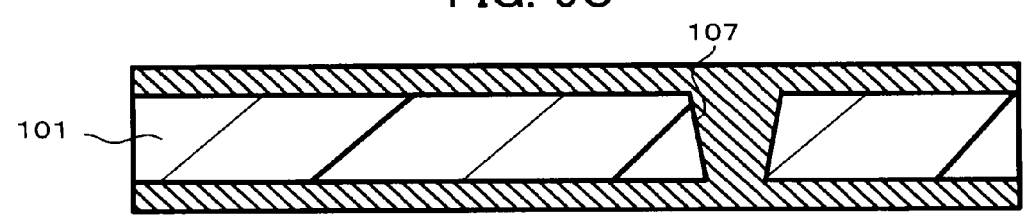
Figure 5D:
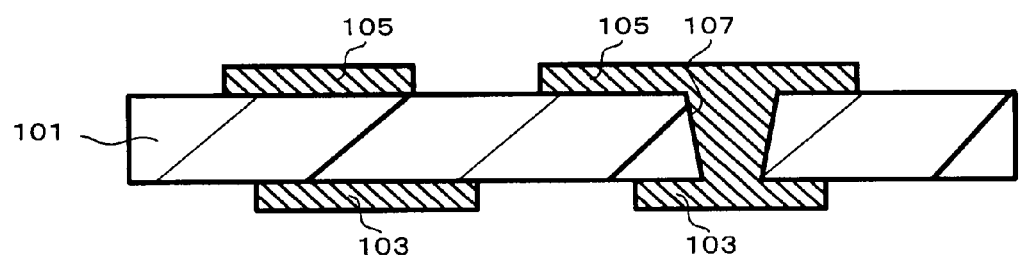
Figure 6A:
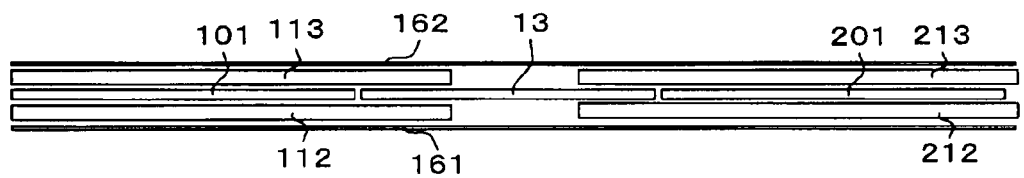
Figure 6B:
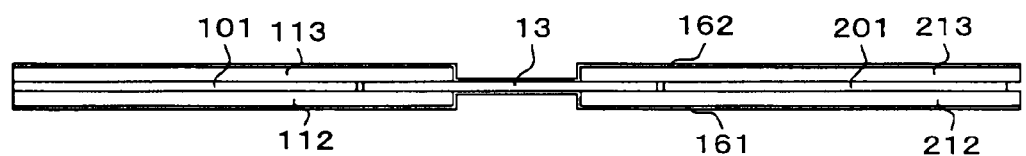
Figure 6C:
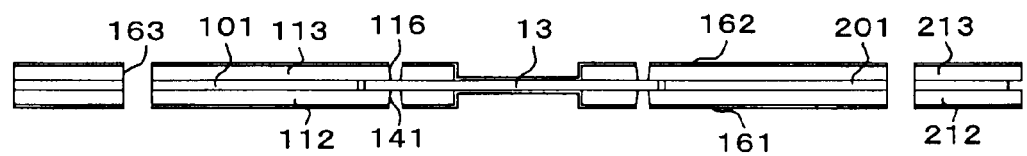
Figure 6D:
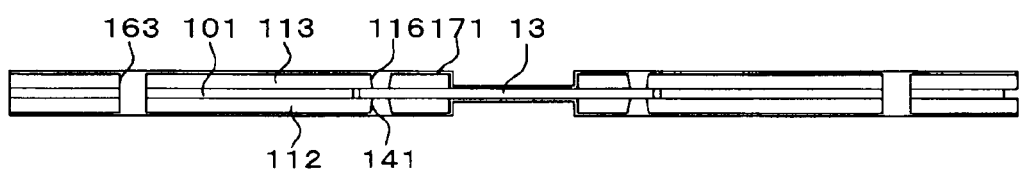
Figure 6E:
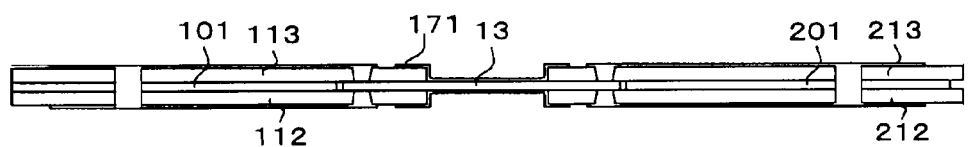
Figure 6F:
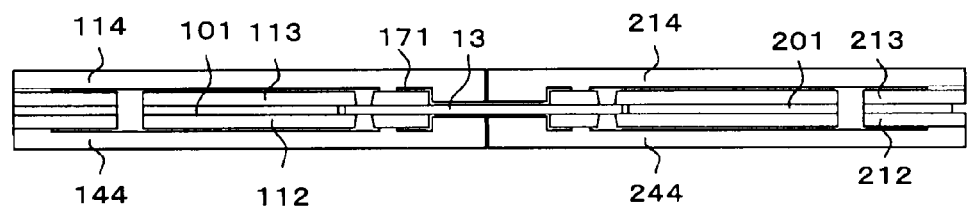
Figure 6G:
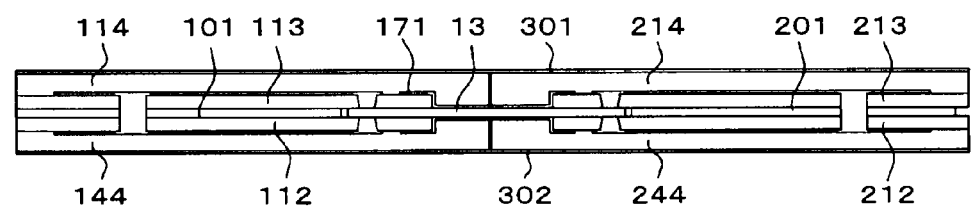
Figure 6H:
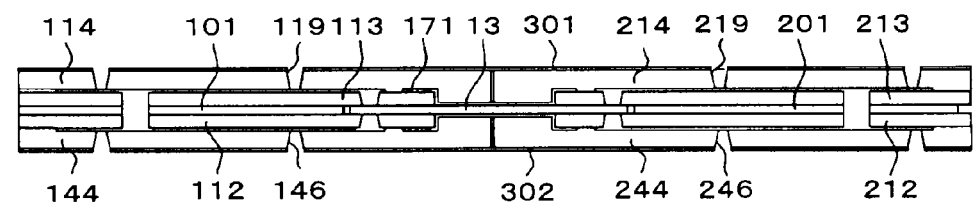
Figure 6I:
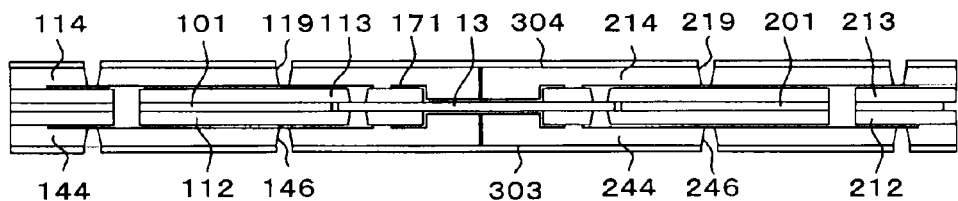
Figure 6J:
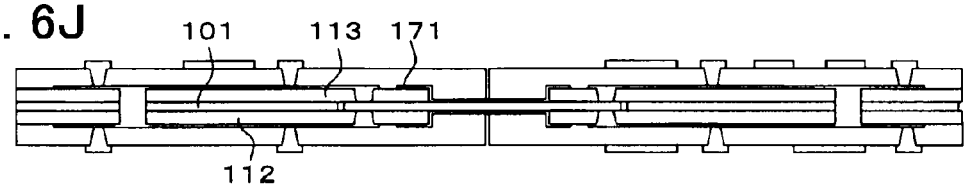
Figure 6K:
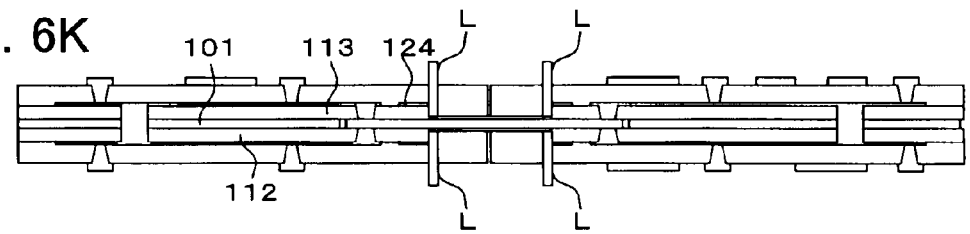
Figure 6L:
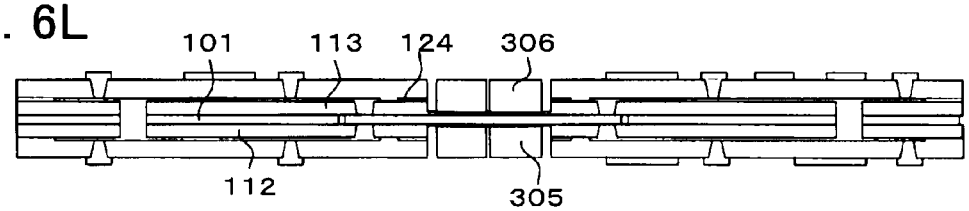
Figure 6M:
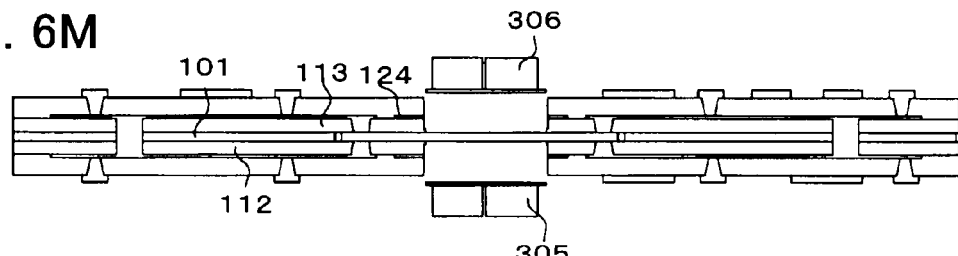
Figure 6N:
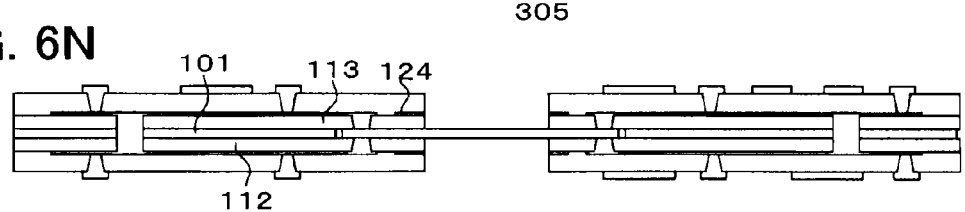
Figure 7:
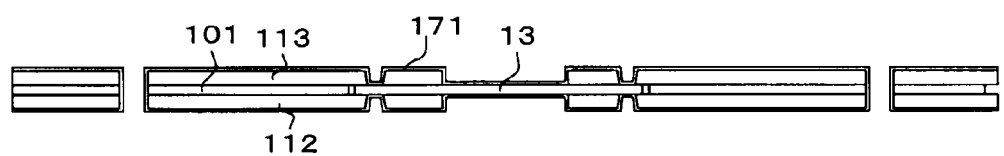

In the structure shown in FIG. 3, vias (141) are formed in first insulation layer (112) and insulation layer (134) of flexible substrate (13). In vias (141), conductor (142) such as copper is filled and connected to extended pattern (143) formed on first insulation layer (112).

Third and fourth upper-layer insulation layers (144, 145) are laminated and disposed on first insulation layer (112). Third and fourth upper-layer insulation layers (144, 145) are also formed with flexible base material or prepreg. In third and fourth upper-layer insulation layers (144, 145), vias (146, 147) are formed respectively.

In the structure shown in FIG. 3, vias (116) are filled vias which are filled with conductor (117a).

Next, a method of manufacturing flexible wiring board (10) with the above structure is described taking as an example the structure shown in FIG. 3. For flexible substrates or insulation layers, polyimide or polyester is used. First, a method of manufacturing flexible substrate (13) is described with reference to FIGS. (4A)-(4C).

As shown in FIG. (4A), a copper film is formed on both surfaces of flexible base material (131) formed with polyimide processed to be a predetermined size. Next, by patterning the copper film, conductive layers (132, 133), each having wiring (13a) and connection pads (13b), are formed. Then, on flexible base material (131) and both conductive layers (132, 133), insulation layers (134, 135) made with polyimide or the like are formed. In doing so, flexible substrate (13) with the structure shown in FIG. 3 is completed. In the following, silver paste is applied on the area that excludes the tip of flexible substrate (13) where connection pads (13b) are formed. Then, by curing the applied silver paste, shield layers (136, 137) are formed.

Then, as shown in FIG. (4B), coverlays (138, 139) are arranged to cover shield layers (136, 137) on the top and bottom surfaces. By pressing coverlays (138, 139), flexible substrate (13) is completed as shown in FIG. (4C).

To form multilayer substrates (11, 12), second flexible base material (101) is prepared as shown in FIG. (5A). A laser is beamed at the via-formation region in second flexible base material (101) to form vias (107) as shown in FIG. (5B). Then, copper plating is performed on the entire second flexible base material (101) and vias (107) are filled with copper as shown in FIG. (5C). Then, by patterning the copper foil (copper plating) on the surfaces of second flexible base material (101), circuit patterns (103, 105) are formed as shown in FIG. (5D).

Next, a method of joining multilayer substrates (11, 12) and flexible substrate (13) is described with reference to FIGS. (6A)-(6N). First, as shown in FIG. (6A), flexible substrate (13), second flexible base material (101) to form multilayer substrate (11) and flexible base material (201) to form flexible substrate (13) are arranged. In addition, flexible base materials to make first insulation layer (112) and second insulation layer (113) are disposed. Regarding flexible substrate (13), flexible base materials (212, 213) are also disposed. Furthermore, on their top and bottom, conductive films (161, 162) such as copper are disposed. As shown in FIG. (6B), they are pressure-pressed. The pressure-pressing is conducted, for example, using hydropressing equipment under the following conditions: temperature of 200° C., pressure of 40 kgf and pressing time approximately 3 hours. In such a pressing treatment, each portion is configured to correspond to each other's shape.

Next, by beaming, for example, a CO2 laser or the like from CO2 laser processing equipment, as shown in FIG. (6C), IVHs (Interstitial Via Hole) (163) are formed according to requirements. Here, vias (116, 141) and others to connect conductive layers (132, 133) of flexible substrate (13) and multilayer substrates (11, 12) are also formed.

Then, as shown in FIG. (6D), copper plating is performed on the entire surface of the structure. The plated copper and existing conductive films (161, 162) are made integrated to form copper film (171) on the entire surface of the substrate. At that time, copper is filled in vias (116, 141, 163). However, as shown in FIG. (7), copper film may be disposed only on the inner surfaces of vias (116, 141, 163) to make them conformed vias. By making such a structure, vias (116, 141, 163) having a structure such as shown in FIG. (2) are obtained.

During the copper plating, substantially all the surfaces of the substrate are covered with conductive films (161, 162) so that direct contact with the plating solution is prevented. Therefore, flexible substrate (13), first insulation layer (112) and second insulation layer (113) will not be damaged by the plating solution.

Then, as shown in FIG. (6E), copper films (171) on the substrate surfaces are patterned. In this step, patterns (117, 117a, 142, 118, 143) connected to conductive layers (132, 133) in flexible substrate (13) are formed. At that time, copper film (171) is left on the edges of first and second insulation layers (112, 113) and on flexible substrate (13).

Then, as shown in FIG. (6F), on first and second insulation layers (112, 113), third and first upper-layer insulation layers (144, 114) are disposed respectively. On multilayer substrate (12), third and first upper-layer insulation layers (244, 214) are also respectively disposed as well. Upper-layer insulation layers (144, 114, 244, 214) are formed with an insulative film such as polyimide, polyethylene, liquid crystal polymer, polyether ether ketone or glass epoxy (for example, 0.2 mm thick or less). Then, by pressing them, first and third upper-layer insulation films (114, 214, 144, 244) are adhered to second and first insulation layers (113, 112, 213, 212).

Then, as shown in FIG. (6G), copper foil (301) is pasted on first upper-layer insulation films (114, 214) using an adhesive agent; and copper foil (302) is pasted on third upper-layer insulation films (144, 244) using an adhesive agent. As for upper-layer insulation films (114, 144, 214, 244), a thermal fusion type is used, then heated to fuse their surfaces, on which copper foils (301, 302) may be pasted.

Next, by a process such as roughening the surfaces of copper foils (301, 302), laser beam reception performance is enhanced. Then, by beaming a laser, as shown in FIG. (6H), vias (119, 146, 219, 246) are formed in first and third upper-layer insulation layers (114, 144, 214, 244). Furthermore, as shown in FIG. (6I), using copper foils (301, 302) as seed layers, field plating is performed on the entire surface to form plated-copper layers (303, 304). During this process, the interiors of vias (119, 146, 219, 246) are filled with copper. Also, by printing conductive paste (such as thermosetting resin containing conductive particles) using screen printing or the like, the paste may be filled in vias (119, 146, 219, 246) and cured. Next, as shown in FIG. (6J), copper-plated layers (303, 304) are patterned to form wiring and filled vias.

After the above, according to the number of layers in multilayer substrates (11, 12), the process is repeated in which flexible base materials are laminated, via holes are formed, plating is performed and plated layers are patterned.

Then, as shown in FIG. (6K), laser "L" is beamed at the areas corresponding to the tips of first and second insulation layers (112, 113, 212, 213). Accordingly, as shown in FIG. (6L), structures (305, 306), which are severed from their surroundings, are formed in the center. Laser "L" is beamed to such an extent that it roughly makes a cutting in copper film (171).

Lastly, as shown in FIG. (6M), structures (305, 306) are removed. At that time, since copper foil (171) and flexible substrate (13) are not adhered, the exposed portions of copper foil (171) are removed along with structures (305, 306). In doing so, as shown in FIG. (6N), flexible wiring board (10) is completed in which the tips of flexible substrate (13) are inserted between the core portions of multilayer substrates (11, 12) (first and second insulation layers 112, 113), and the lands of multilayer substrates (11, 12) and connection pads of flexible substrate (13) are connected through plating.

In the above, flexible wiring board (10) according to an example of the present invention was described. However, the present invention is not limited to the above example. For example, the material, size and number of layers of each of the above-described layers may be freely modified. As another example, a circuit pattern may be formed at any position and the circuit pattern may also be formed on any layer.

Figure 8:
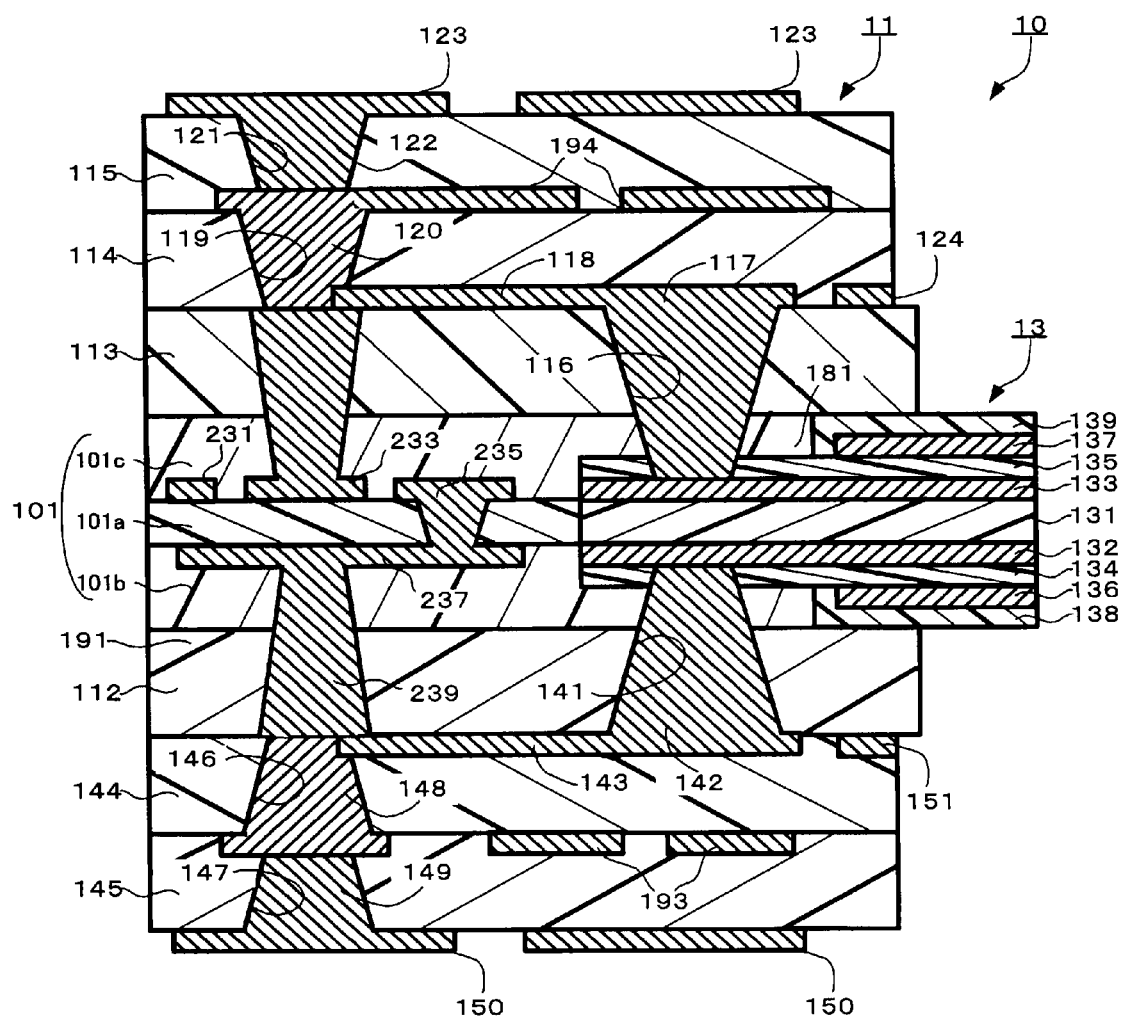
Figure 9:
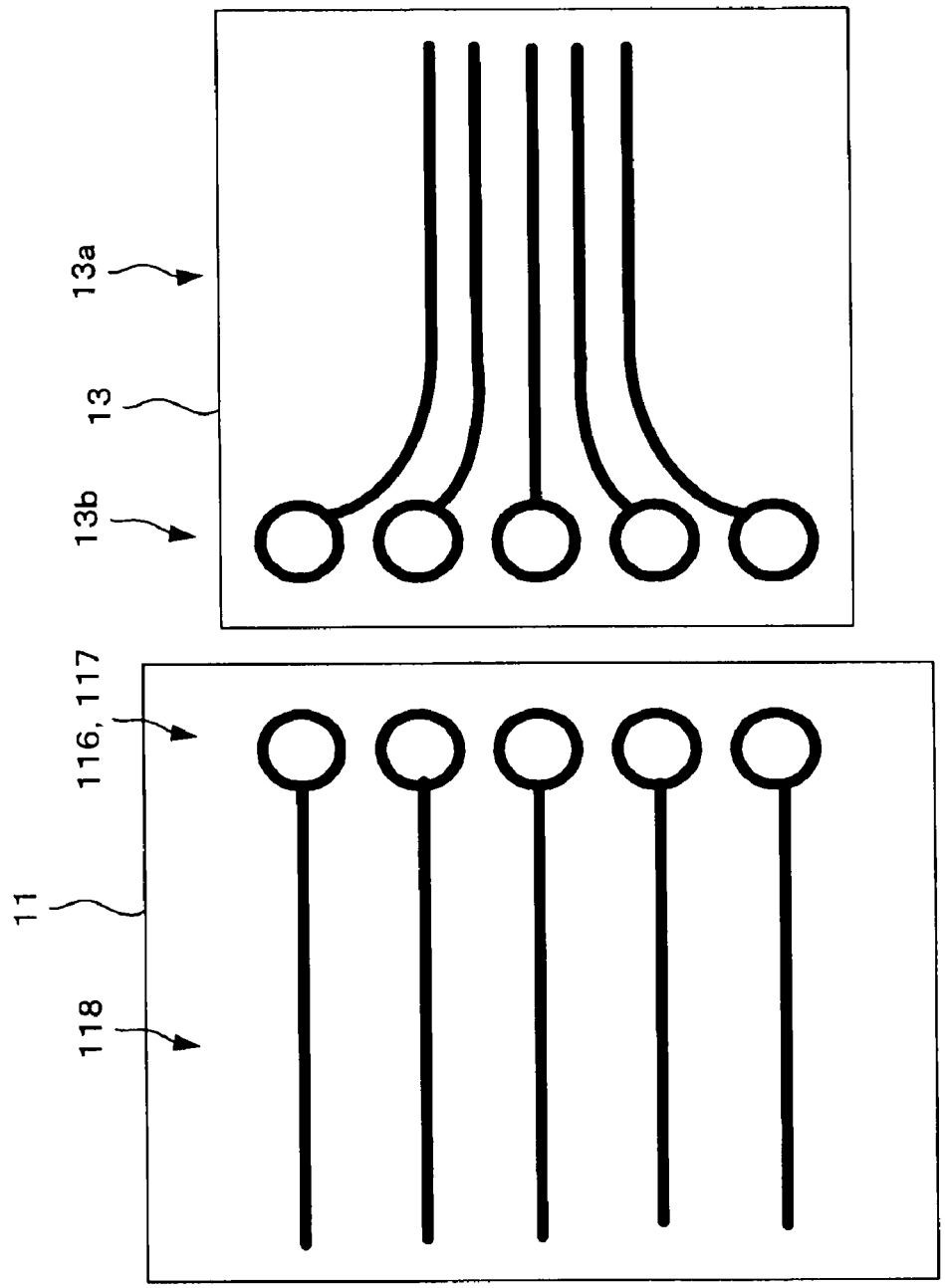
Figure 10:
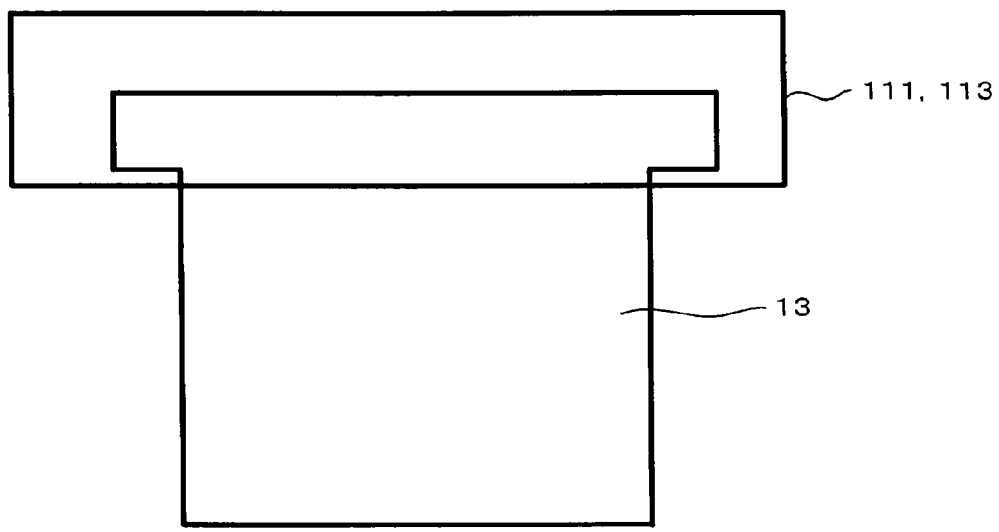
Figure 11:
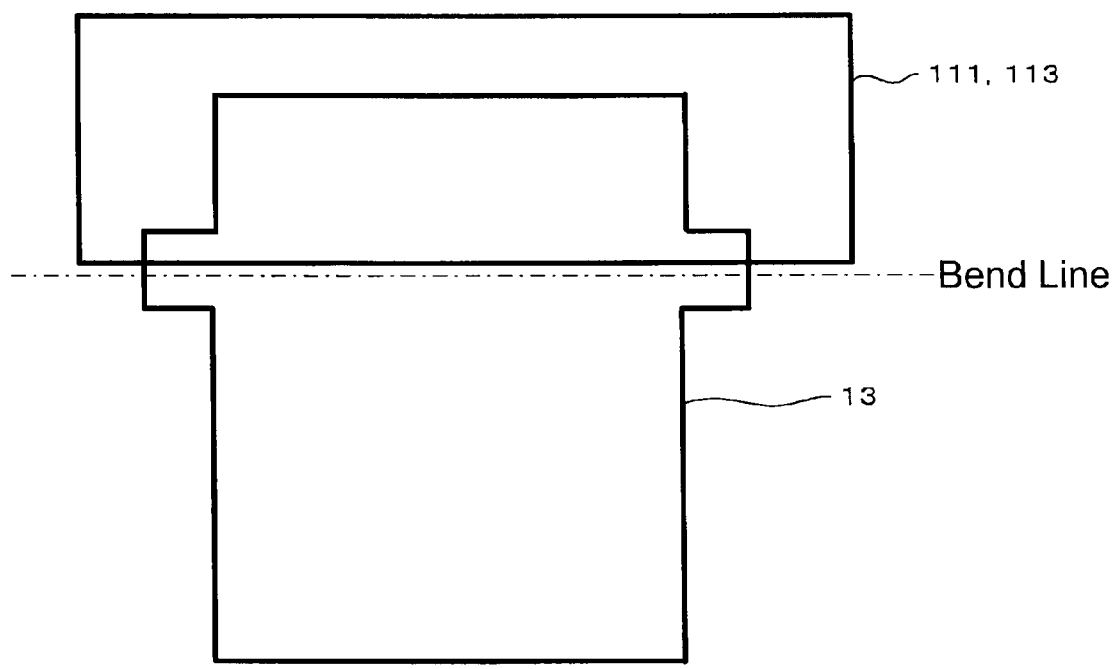

Also, in the above example, second flexible base material (101) in multilayer substrates (11, 12) was formed with a layer of flexible sheet. However, as shown in FIG. 8, for example, it may be formed with multiple flexible sheets. In the structure shown in FIG. (8), second flexible base material (101) is formed with three layers of flexible base material (101a, 101b, 101c). Flexible base material (101a) has substantially the same thickness as first flexible base material (131) of flexible substrate (13). Meanwhile, flexible base material (101b) is adhered to flexible base material (101a), and its edge is configured to correspond to the outline of the different levels formed by coverlay (138) at the tip of flexible substrate (13).

Also, flexible base material (101c) is adhered to flexible base material (101a), and its tip is configured to correspond to the outline of the different levels formed by coverlay (139) at the tip of flexible substrate (13).

By so structuring, between flexible base material (101b) and flexible base material (101c), a tip of flexible substrate (13) (first flexible base material (131), conductive layers (132, 133), insulation layers (134, 135)) is inserted and anchored; furthermore, between second flexible base material (101) (101a-101c) and first and second insulation layers (112, 113), an even longer region of the tip of flexible substrate (13) is inserted and anchored. Accordingly, multilayer substrates (11, 12) may anchor and support flexible substrate (13) even more securely. Thus, the connection reliability between multilayer substrates (11, 12) and flexible substrate (13) is also high.

When forming second flexible base material (101) with multiple flexible sheets, a circuit pattern may be formed in each sheet as shown by reference numerals (231-239) in FIG. (8).

The material for flexible base materials (101a-101c) may be the same or different. For example, flexible base material (101a) may be formed with polyimide, and flexible base materials (101b, 101c) may be formed with polyester.

In such a structure, by combining and thermopressing flexible substrate (13) and second flexible base material (101) by means of an adhesive agent, both are anchored. Furthermore, by disposing the first and second insulation layers, applying an adhesive agent if necessary, and thermopressing them, they will be anchored.

Also, the first flexible base material to structure flexible substrate (13) may be formed by laminating multiple flexible base materials. The material for each flexible base material may be the same or different.

Also, wiring patterns formed on multilayer substrates (11, 12) and flexible substrate (13) are not limited to the example shown in FIG. (1), but may be configured, for example, as shown in FIG. (9), to fan out from flexible substrate (13) toward multilayer substrates (11, 12). Namely, in flexible substrate (13), the pitch of connection pads (13b) may be larger than the pitch of wiring (13a). In doing so, more wiring may be arranged in flexible substrate (13) and a flexible rigid wiring board with high-density wiring may be formed.

Still further, to improve strength at the borders between multilayer substrates (11, 12) and flexible substrate (13), part of flexible substrate (13) may be configured to be wider than the rest as shown in FIGS. (10, 11). By doing so, the joint areas between flexible substrate (13) and multilayer substrates (11, 12) increase, thus enhancing the connection reliability of vias.

In an example shown in FIG. (10), for instance, the tips of flexible substrate (13) are extended to enlarge the size of the sections anchored by multilayer substrates (11, 12). By doing so, the strength in the tips of flexible substrate (13) increases, thus enhancing their resistance against mechanical bending.

Also, in the example shown in FIG. (11), projected portions are formed where flexible substrate (13) is repeatedly bent (such as the places corresponding to the edge lines of multilayer substrates (11, 12)) to enhance strength in the places which will be repeatedly bent.

Other example embodiments of the invention are now discussed. In the above embodiment, insulation layers were laminated on the flexible base material without an adhesive layer disposed in between. Also, without an adhesive layer, upper-layer insulation layers were laminated on the insulation layers. A flexible wiring substrate according to the present invention is not limited to such an embodiment.

For example, a flexible wiring substrate may be structured as shown in FIG. (12). In such a structure, first insulation layer (112) is laminated beneath flexible base material (101) by means of first adhesive layer (180); and second insulation layer (113) is laminated on flexible base material (101) by means of first adhesive layer (181).

Also, first upper-layer insulation layer (144) is laminated beneath first insulation layer (112) by means of second adhesive layer (182); and first upper-layer insulation layer (114) is laminated on second insulation layer (113) by means of second adhesive layer (183).

Second upper-layer insulation layer (145) is laminated beneath first upper-layer insulation layer (144) by means of third adhesive layer (184); also, second upper-layer insulation layer (115) is laminated on first upper-layer insulation layer (114) by means of third adhesive layer (185).

Also, between insulation layer (135) and flexible base material (101c), adhesive layer (186) is formed; and between insulation layer (134) and flexible base material (101b), adhesive layer (187) is formed. Further, between flexible base material (101a) and flexible base material (101c), adhesive layer (188) is formed; and between flexible base material (101a) and flexible base material (101b), adhesive layer (189) is formed.

Flexible base materials (101a, 101b, 101c) are formed with polyimide, polyester or the like. In addition, first insulation layer (113), second insulation layer (112), first upper-layer insulation layers (114, 144) and second upper-layer insulation layers (115, 145) may also be formed with a resin such as polyimide, polyester or the like.

Adhesive layers (180, 181, 182, 183, 184, 185, 186, 187, 188, 189) are formed by curing an adhesive agent. The adhesive agent is preferred to have a high elasticity ratio, a high glass-transition temperature point and high heat resistance, let alone high adhesiveness. Also, to avoid having a negative impact on the environment, it is preferred to use a halogen-free type.

As for an adhesive agent to form adhesive layers (180, 181, 182, 183, 184, 185, 186, 187, 188, 189), specifically, a thermosetting type epoxy adhesive agent may be used. To cure the adhesive agent, thermal treatment is conducted at temperatures of 100-180° C. for a period of several dozen minutes to a few hours. The thickness of adhesive layers (180, 181, 182, 183, 184, 185, 186, 187, 188, 189), formed by curing the adhesive agent, may be made in the range of 10-30 μm.

Figure 12:
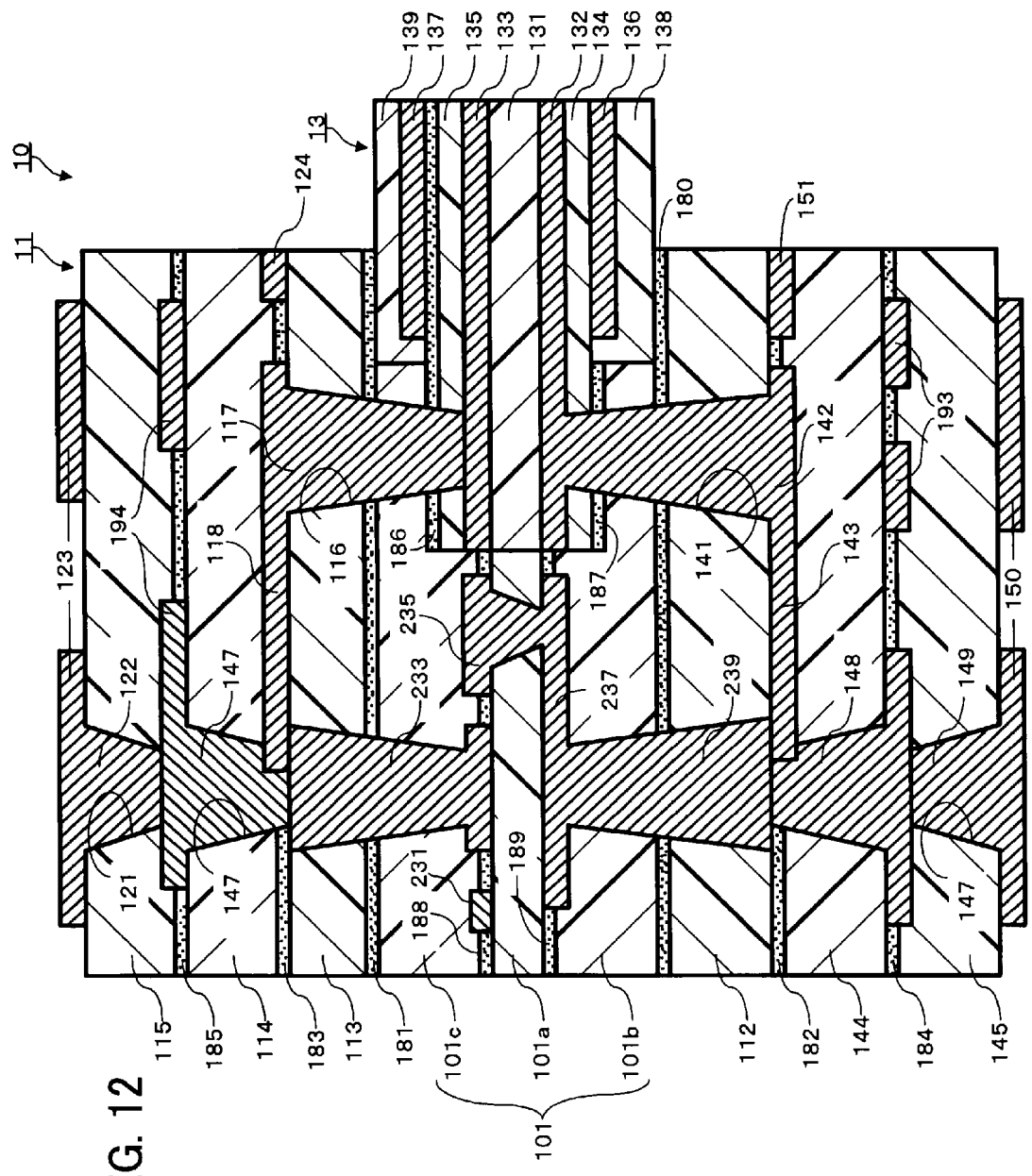
Figure 13A:
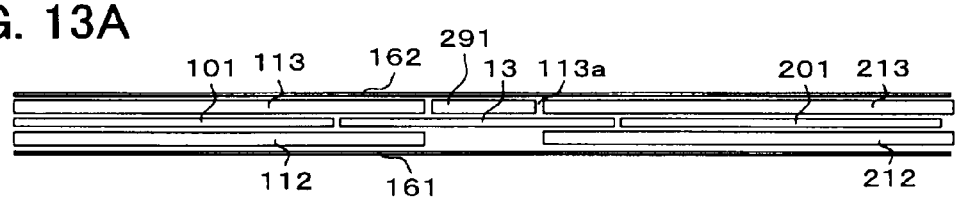
Figure 13B:
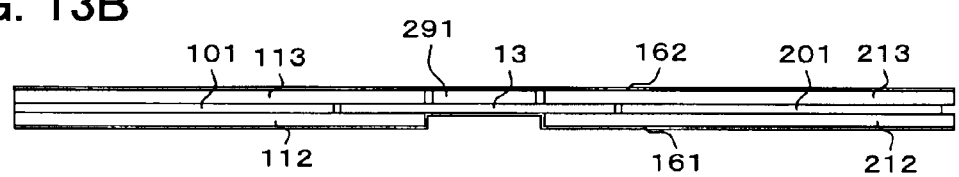
Figure 13C:
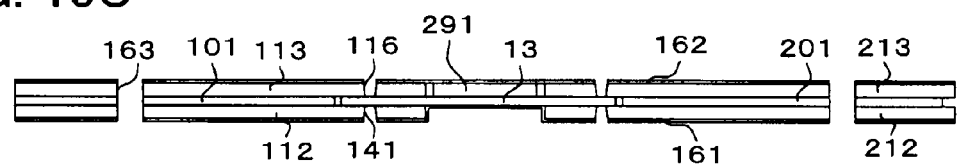
Figure 13D:
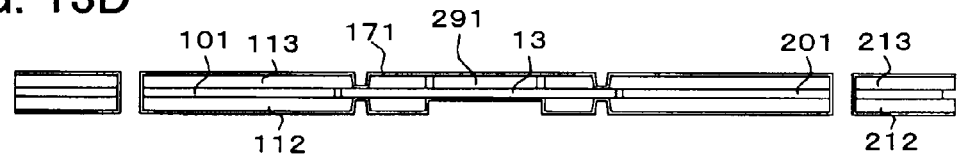
Figure 13E:
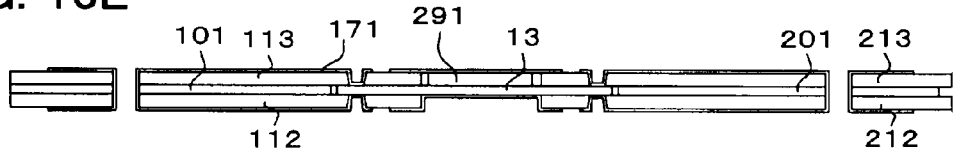
Figure 13F:
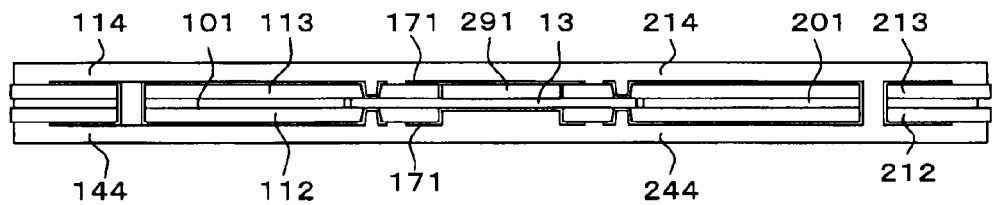
Figure 13G:
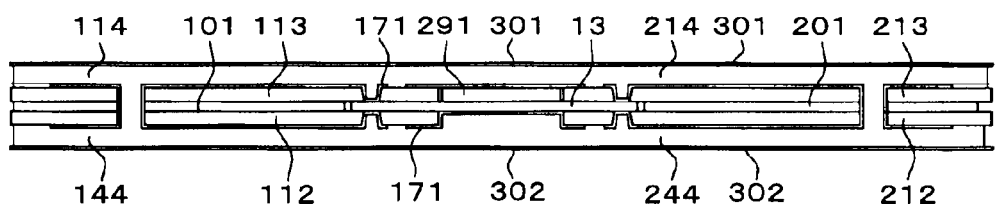
Figure 13H:
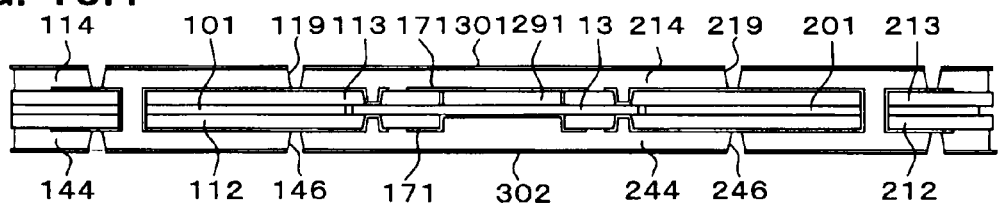
Figure 13I:
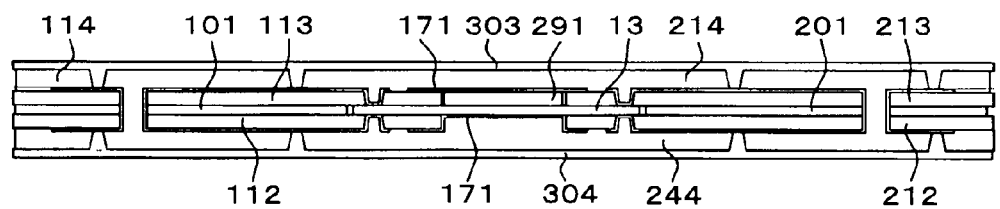
Figure 13J:
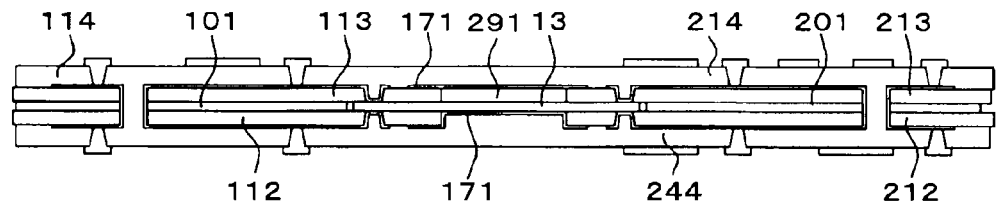
Figure 13K:
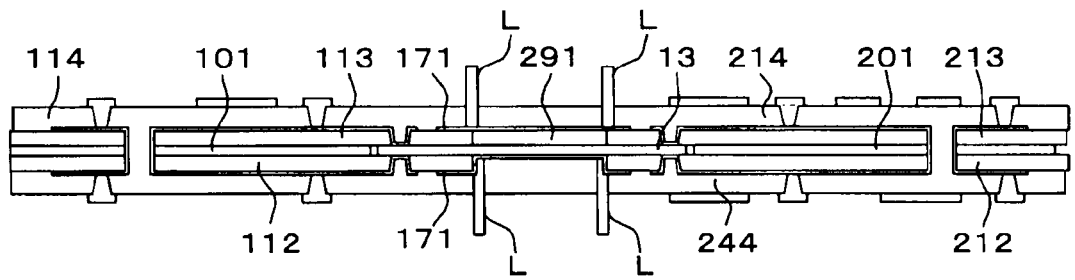
Figure 13L:
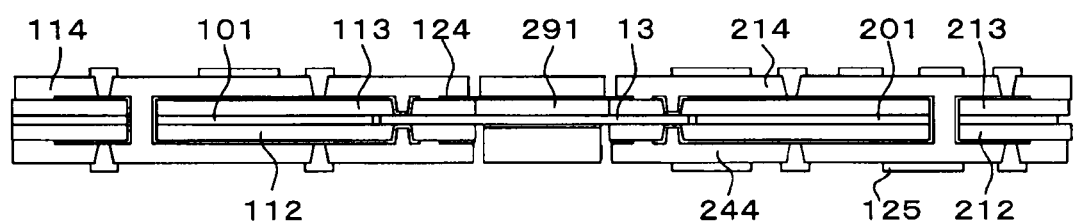
Figure 13M:
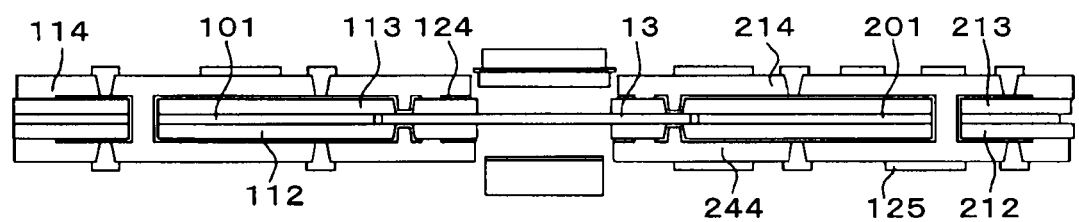
Figure 13N:
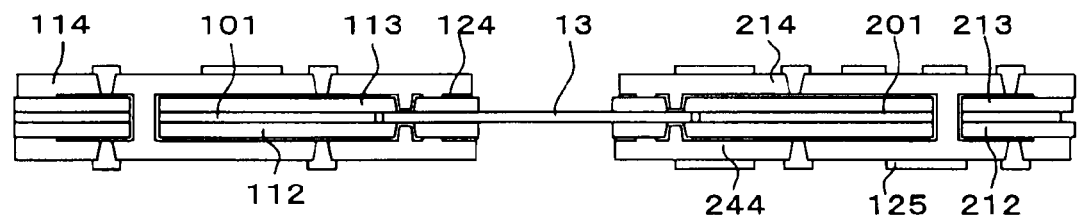
Figure 14A:
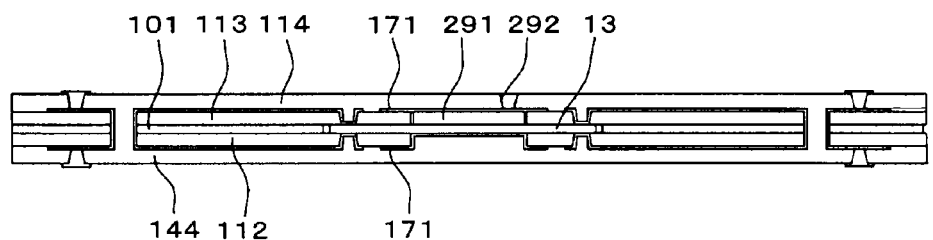
Figure 14B:
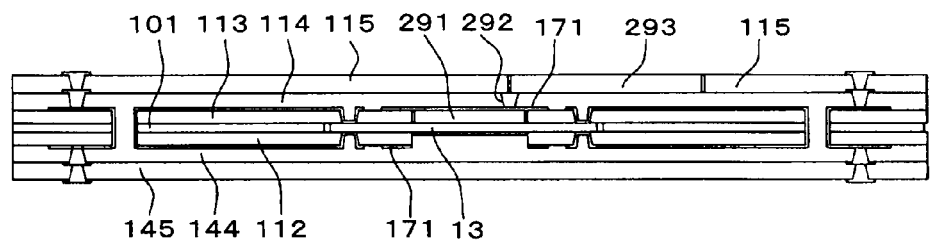
Figure 14C:
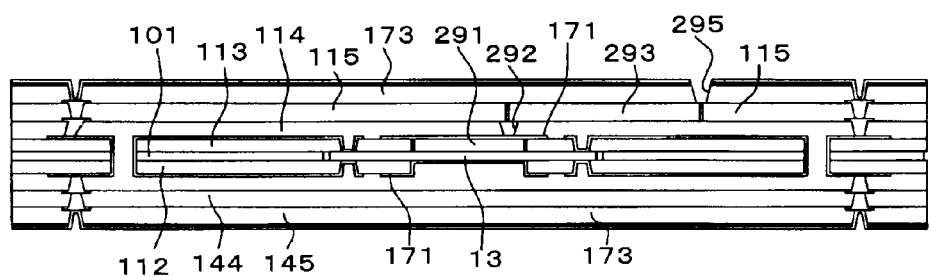
Figure 14D:
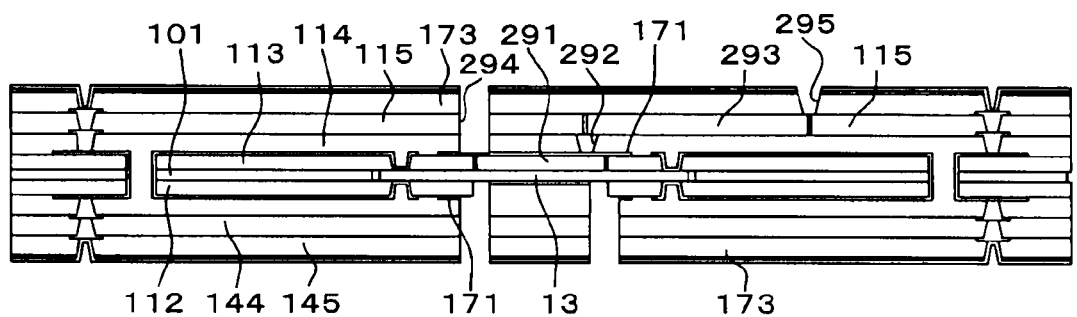
Figure 14E:
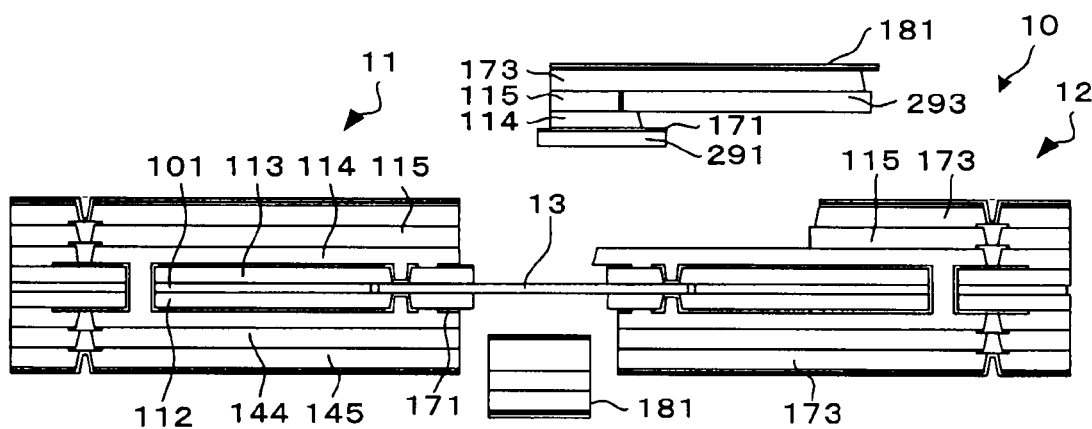

In the present embodiment, as shown in FIG. 12, the thickness of adhesive layers (180, 181, 182, 183, 184, 185, 186, 187, 188, 189) is made thinner than that of conductive patterns. However, it may be made the same thickness as the conductive patterns, or it may be made thicker than the conductive patterns.

With first adhesive layer (180), the adhesiveness between first insulation layer (112) and flexible base material (101) may be enhanced. With first adhesive layer (181), the adhesiveness between second insulation layer (113) and flexible base material (101) may be enhanced.

Also, by disposing second adhesive layer (182), the adhesiveness between first upper-layer insulation layer (144) and first insulation layer (112) may be enhanced. By disposing second adhesive layer (183), the adhesiveness between first upper-layer insulation layer (114) and second insulation layer (113) may be enhanced.

Also, by disposing third adhesive layer (184), the adhesiveness between second upper-layer insulation layer (145) and first upper-layer insulation layer (144) may be enhanced. By forming third adhesive layer (185), the adhesiveness between second upper-layer insulation layer (115) and first upper-layer insulation layer (114) may be enhanced.

Also, by disposing adhesive layer (186), the adhesiveness between insulation layer (135) and flexible base material (101c) may be enhanced. By disposing adhesive layer (187), the adhesiveness between insulation layer (134) and flexible base material (101b) may be enhanced.

Also, by forming adhesive layer (188), the adhesiveness between flexible base material (101a) and flexible base material (101c) may be enhanced. By forming adhesive layer (189), the adhesiveness between flexible base material (101a) and flexible base material (101b) may be enhanced.

A method of manufacturing flex-rigid wiring board (10) is not limited to the example described above with reference to FIGS. (6A)-(6N). For example, as shown in FIG. (13A), separator (291) may be placed in space (113a) between second insulation layers (113) and (213) in the step described with reference to FIG. (6A). Separator (291) is formed, for example, with a cured prepreg, polyimide film or the like. Also, an adhesive agent may be disposed between the separator and copper foil (162).

Next, the entire structure is pressed as shown in FIG. (13B). In the following, as shown in FIG. (13C), vias (116, 141, 163) are formed. Then, as shown in FIG. (13D), using conductive film (162) as a seed layer, copper film (171) is formed. Then, as shown in FIG. (13E), copper film (171) is patterned to form copper patterns. Then, as shown in FIG. (13F), on first insulation layers (112, 212), second upper-layer insulation layer (prepreg) (144) is disposed. Also, on second insulation layers (113, 213), first upper-layer insulation layer (prepreg) (114) is disposed. Then, they are pressed.

Copper foils (301, 302) are then respectively pasted on upper-layer insulation films (114, 144) by means of an adhesive agent.

As for upper-layer insulation films (114, 144), a thermal fusion type is used, and then heated to fuse their surfaces, on which copper foil (181) may be pasted. Then, a process such as roughening the surfaces of copper foils (301, 302) is conducted to enhance laser beam reception performance. Then, by beaming a laser, as shown in FIG. (13H), vias (119, 146, 219, 246) are formed in upper-layer insulation layers (114, 144). Furthermore, as shown in FIG. (13I), using copper foils (301, 302) as seed layers, field plating is performed on the entire structure to form copper-plated layers (303, 304). At that time, the interiors of vias (119, 146, 219, 246) are filled with copper. Also, by printing conductive paste (such as thermosetting resin containing conductive particles) using screen printing or the like, the paste may be filled in vias (119, 146, 219, 246) and cured.

Then, as shown in FIG. (13J), copper-plated layers (303, 304) are patterned to form wiring and filled vias.

After the above, according to the number of layers of multilayer substrates (11, 12), the steps are repeated in which flexible base materials are laminated, via holes are formed, plating is performed and plated layers are patterned.

Then, as shown in FIG. (13K), laser "L" is beamed from the top and bottom sides of flexible base material (13) to cut off upper-layer insulation layers (114, 144). Accordingly, as shown in FIG. (13L), structures (305, 306) separated from their surroundings are formed in the center. Laser "L" is beamed to such an extent that it roughly makes a cutting in copper film (171).

Then, as shown in FIG. (13M), structures (305, 306) are removed. At that time, since copper film (171) and flexible base material (13) are not adhered, the exposed portions of copper film (171) are removed along with structures (305, 306). In so doing, as shown in FIG. (13N), flexible wiring board (10) is completed in which the tips of flexible substrate (13) are inserted between the core portions (first and second insulation layers 112, 113) of multilayer substrates (11, 12), and the lands of multilayer substrates (11, 12) and connection pads of the flexible substrate are connected through plating.

A manufacturing method, for example, shown in FIGS. (14A)-(14D) may also be employed. In such a manufacturing method, after separator (291) is first placed as shown in FIG. (13A), the steps shown in FIGS. (13B)-(13F) are carried out. Then, using a laser or the like, cutting line (292) is formed on the portion above separator (291) in upper-layer insulation layer (114) as shown in FIG. (14A).

Then, on upper-layer insulation layer (114), upper-layer insulation layer (115) is disposed and on upper-layer insulation layer (155), upper-layer insulation layer (145) is disposed. At that time, separator (293), an edge of it positioned on cutting line (292), is substituted for part of upper-layer insulation layer (115) as shown in FIG. (14B).

Then, as shown in FIG. (14C), on upper-layer insulation layer (115) and separator (291) copper-foil sheet with resin (173) is disposed, and copper-foil sheet with resin (174) is disposed on upper-layer insulation layer (145). Then, vias are formed in upper-layer insulation layer (115), and copper plating is performed. As shown in FIG. (14D), using laser beams or the like, cutting lines (294, 295) are formed in part of an edge of separator (291) and in part of another edge of separator (291). Lastly, as shown in FIG. (14E), structure (296) formed with cutting line (294), separator (291), cutting line (292), separator (293) and cutting line (295) is removed. In so structuring, the area that does not contribute to the formation of circuits may be removed and the volume of the wiring board may be decreased.

In the above description, the steps of manufacturing multilayer substrate (12) are modified. However, the steps of manufacturing rigid substrate (11) or those of both multilayer substrates (11, 12) may also be modified. Also, examples of modification in the steps of manufacturing the upper portion of flexible wiring board (10) were shown. However, the lower portion of flexible wiring board (10) or the entire structure may be manufactured by the modified method.

The present invention was carried out considering the demand for a flexible wiring board which offers higher reliability, especially higher connection reliability, and which is also easy to manufacture at low cost. An objective is to provide a flexible wiring board with high reliability, especially high connection reliability, and its manufacturing method. Also, another objective of the present invention is to provide a flexible wiring board which is easy to manufacture at low cost, and its manufacturing method.

To achieve the above objectives, a flexible wiring board according to a first aspect of the present invention is structured with a first flexible base material (13) with conductive patterns; a second flexible base material (101) arranged horizontal to the flexible substrate; insulation layers (112, 113) that cover the first flexible base material and the second flexible base material and that expose at least part of the first flexible base material; and conductive patterns (118, 143) formed on the insulation layers. It is characterized by conductive patterns (132, 133) in the flexible base material and conductive patterns (118, 143) on the insulation layers being connected through plating.

For example, first flexible base material (131) and second flexible base material (101) are formed with different materials; the first flexible base material is formed with a material having more flexibility and higher abrasion and heat resistance than the second flexible base material.

For example, the second flexible base material is formed by laminating multiple flexible sheets (101a-101c). In such a case, for example, first flexible sheet (101b) and second flexible sheet (101c) are disposed so as to sandwich a tip of first flexible base material (131). Furthermore, the first flexible sheet and second flexible sheet (101b, 101c) may be configured to correspond to the outline of first flexible base material (131).

For example, first and second insulation layers (112, 113) are preferred to be configured to correspond to the outline of the tip of first flexible base material (131) and that of the second flexible base material (101).

For example, on the surfaces of the second flexible base material, conductive patterns (103, 105) are formed.

For example, from both the top and bottom sides, insulation layers (112, 113) cover the border region between the tip of first flexible base material (131) and the edge of second flexible base material (101). In such a case, for example, vias (116, 141) are formed in insulation layers (112, 113), and conductive patterns (118, 143) on the insulation layers are connected to conductive patterns (133, 132) in the first flexible base material through the vias.

For example, on the insulation layers, upper-layer insulation layers (114, 144) are further formed. In such a case, upper-layer conductive patterns (193, 194) are formed on the upper-layer insulation layers, and conductive patterns (118, 143) on the insulation layers and the upper-layer conductive patterns are connected through upper-layer vias (120, 148) filled with plated metal.

For example, on the insulation layers, first upper-layer insulation layers (114, 144) are further formed; on the first upper-layer insulation layers, first upper-layer conductive patterns (194, 193) are formed; on the first upper-layer conductive patterns, second upper-layer insulation layers (115, 145) are formed; on the second upper-layer insulation layers, second upper-layer conductive patterns (123, 150) are formed; the conductive patterns on the insulation layers and the first upper-layer conductive patterns are connected through first upper-layer vias (120, 148) filled with plated metal; and substantially directly on top of the first upper-layer vias in the second upper-layer insulation layers, second upper-layer vias (122, 149) are formed that connect the first upper-layer conductive patterns and the second upper-layer conductive patterns and are filled with plated metal.

On the insulation layers, upper-layer insulation layers are formed; on the upper-layer insulation layers, upper-layer vias are formed that are connected to the conductive patterns on the insulation layers; and on the upper-layer insulation layers, conductive patterns connected to the upper-layer vias are formed.

Also, a flexible wiring board according to the second aspect of the present invention is structured with first flexible base material (131) having conductive patterns; second flexible base material (101) arranged horizontal to the first flexible base material; and insulation layers (112, 113), which cover the first flexible base material and the second flexible base material and expose at least part of the first flexible base material. It is characterized by vias (116, 141) being formed in the insulation layers; conductive patterns (118, 143) being formed on the insulation layers; and the conductive patterns on the insulation layers being connected to conductive patterns (132, 133) in the first flexible base material by means of the vias.

For example, it is preferred that first flexible base material (131) and second flexible base material (101) be formed with different materials, and that the first flexible base material be formed with a material having higher flexibility and higher abrasion and heat resistance than the second flexible base material.

By forming the first flexible base material with a material having high flexibility and high abrasion resistance, its durability when the exposed portion of the first flexible base material is bent may be enhanced. By forming the first flexible base material with a material having high thermal resistance, the base material will not be damaged by heat during the reflow process for soldering when mounting an electronic component in the first flexible base material. Thus, the electronic component may be mounted.

For example, the second flexible base material may be formed by laminating multiple flexible sheets (101a-101c). In such a case, first flexible sheet (101b) and second flexible sheet (101c) are disposed so as to sandwich a tip of first flexible base material (131). Furthermore, first flexible sheet and second flexible sheet (101b, 101c) are configured to correspond to the outline of the first flexible base material.

For example, first and second insulation layers (112, 113) may be configured to correspond to the outline of the tip of the first flexible base material and that of the second flexible base material.

For example, on the insulation layers, upper-layer insulation layers (114, 115, 144, 145) are formed; on the upper-layer insulation layers, upper-layer conductive patterns (123, 150) are formed; and conductive patterns on the insulation layers (118, 143) and upper-layer conductive patterns (123, 150) are connected through upper-layer vias (119, 121, 146, 147) formed in the upper-layer insulation layers and filled with plated metal.

For example, vias are filled with metal.

For example, the vias penetrate the insulation layers and are filled with plated metal; on the insulation layers, upper-layer insulation layers and upper-layer conductive patterns are laminated; in the upper-layer insulation layers, upper-layer vias are formed that connect the conductive patterns formed on the insulation layers and the upper-layer conductive patterns; and the upper-layer vias are connected to the vias filled with the plated metal.

Beyond the border between the first flexible base material and the second flexible base material, conductive patterns on the insulation layers are extended to the edges of the insulation layers.

Plane conductive layers may be formed on the edge of the insulation layers positioned on the side of the first flexible base material.

For example, the first flexible base material has multiple connection pads which are connected to vias, and the pitch of the connection pads is wider than the pitches of the multiple conductive patterns formed in the first flexible base material. The conductive patterns are formed in such a way that their pitches widen toward the connection pads and are electrically connected to corresponding connection pads.

For example, on the insulation layers, upper-layer insulation layers are formed; on the upper-layer insulation layers, upper-layer conductive patterns are formed; the conductive patterns on the insulation layers and the upper-layer conductive patterns are connected through the upper-layer vias formed in the upper-layer insulation layers; and the edges of the insulation layers on the side of the first flexible base material protrude beyond the edges of the upper-layer insulation layers on the side of the first flexible base material.

For example, on the insulation layers, upper-layer insulation layers are formed; on the upper-layer insulation layers, upper-layer conductive patterns are formed; the conductive patterns on the insulation layers and the upper-layer conductive patterns are connected through the upper-layer vias formed in the upper-layer insulation layers; and in the upper-layer vias, cured conductive paste is filled.

Also, a flexible wiring board according to the third aspect of the present invention is structured with a first flexible base material having conductive patterns and protective layers to cover the conductive patterns; a second flexible base material arranged horizontal to the first flexible base material; insulation layers which cover the first flexible base material and the second flexible base material and expose at least part of the flexible base material; and conductive patterns formed on the insulation layers. It is characterized by the conductive patterns in the first flexible base material and the conductive patterns on the insulation layers being connected through plating by means of vias formed in the insulation layers.

For example, the vias formed in the insulation layers penetrate the protective layers. For example, by means of the vias that are formed in the insulation layers and penetrate the protective layers, the conductive patterns formed on the insulation layers and the conductive patterns in the first flexible base material are connected.

For example, the first flexible base material and the second flexible base material are formed with different materials, and the first flexible base material is formed with a material having more flexibility and higher abrasion and heat resistance than the second flexible base material.

For example, the second flexible base material is formed by laminating multiple flexible sheets.

For example, the second flexible base material is formed by laminating multiple flexible sheets; and the first flexible sheet (101b) and second flexible sheet (101c) are disposed so as to sandwich the tip of first flexible base material (101a).

For example, the second flexible base material is formed by laminating multiple flexible sheets (101a-101c); first flexible sheet (101b) and second flexible sheet (101c) are disposed so as to sandwich the tip of first flexible base material (13); the first flexible base material has different levels at the tip; and first flexible sheet and second flexible sheet (101b, 101c) are configured to correspond to the outline of the first flexible base material.

For example, the first flexible base material has different levels at the tip, and the first and second insulation layers (112, 113) are configured to correspond to the outline of the tip of the first flexible base material and that of the second flexible base material.

For example, in reference to the first flexible base material, the width of the section where the first flexible base material and the insulation layers are stacked is wider than the width where they are not stacked.

For example, in reference to the first flexible base material, the width of the border between the first flexible base material and the insulation layers is wider than the rest.

For example, the protective layer includes an insulative film. In the insulation layers and the insulative films, vias are formed that penetrate them and electrically connect the conductive patterns on the insulation layers and the conductive patterns formed in the first flexible base material.

The protective layer in the first flexible base material includes, for example, an electromagnetic shield layer.

For example, in the first flexible base material, a conductive pattern is formed, an insulative film is formed on the conductive pattern and an electromagnetic shield layer is formed on the insulative film.

For example, in the first flexible base material, a conductive pattern is formed; on the conductive pattern, an insulative film is formed; on the insulative film, an electromagnetic shield layer is formed; and on the electromagnetic shield layer, a protective layer is formed.

For example, in the first flexible base material, a conductive pattern is formed; on the conductive pattern, an insulative film is formed; on the insulative film, an electromagnetic shield layer is formed; and on the electromagnetic shield layer, a protective layer which is in contact with the insulation layer is formed.

A method of manufacturing a flexible board according to the present invention is characterized by arranging a first flexible base material having a conductive pattern and an adjacent second flexible base material; covering the border between the flexible base material and non-flexible base material using an insulation layer which has a conductive pattern and contains inorganic material; forming a via that penetrates the insulation layer and reaches the conductive pattern in the flexible base material; and connecting the conductive pattern in the flexible base material and the conductive pattern on the insulation layer through plating by means of the via.

First flexible base material (131) and second flexible base material (10) are formed with different materials.

The first flexible base material is formed with a material having higher flexibility and higher abrasion and heat resistance than the second flexible base material.

The first flexible base material is made of, for example, polyimide, liquid crystal polymer or polyether ether ketone. The second flexible base material is made of, for example, polyester or glass-epoxy material (the thickness of the board is 0.2 mm or less).

For example, by the above-described plating, the interior of the via is filled with plated metal.

For example, using the insulation layers, both the top and bottom sides of the border between the flexible base material and the non-flexible base material are covered.

The above flexible wiring board may be manufactured, for example, by preparing a first flexible base material having a conductive pattern and a second flexible base material having a conductive pattern; disposing the first and second flexible base materials adjacent to each other; disposing insulation layers (112, 113) on the border region between the first and second flexible base materials; further disposing conductive layers (161, 162) on the insulation layers; pressing them; forming vias that penetrate the insulation layers and reach the conductive layers; plating the resultant structure to form plated layers on the surfaces and vias; and patterning the plated layers.

Moreover, the following may be conducted: on the patterned plated layers, disposing second insulation layers; in the second insulation layers, forming vias that reach the conductive layers on the insulation layers; plating the resultant structure to form plated layers on its surfaces and vias; and patterning the plated layers.

Furthermore, the conductor on the first flexible base material may be removed.

Obviously, numerous modifications and variations of the present invention are possible in light of the above teachings. It is therefore to be understood that within the scope of the appended claims, the invention may be practiced otherwise than as specifically described herein.

What is claimed is:

1. A flexible wiring board comprising:
    a first flexible base material having a first conductor pattern formed thereon such that side surfaces of the first conductor pattern extend upwardly from the first flexible base material;
    a second flexible base material disposed adjacent to the first flexible base material;
    a first circuit pattern formed on a first surface of the second flexible base material such that side surfaces of the first circuit pattern extend upwardly from the first surface of the second flexible base material;
    a second circuit pattern formed on a second surface of the second flexible base material which opposes the first surface of the second flexible base material;
    a filled via structure provided within said second flexible base material and connecting the first circuit pattern to the second circuit pattern;
    an insulating layer covering the first flexible base material and the second flexible base material, the insulating layer being a heat pressed layer which contacts at least the side surfaces of the first conductor pattern and the side surfaces of the first circuit pattern such that the insulating layer conforms to a shape of the first circuit pattern and the first flexible base material having the first conductor pattern thereon, wherein the insulating layer having an opening exposing at least one portion of the first flexible base material;
    a second conductor pattern formed on the insulating layer; and
    a plating layer connecting the first conductor pattern of the first flexible base material and the second conductor pattern on the insulating layer.

2. The flexible wiring board according to claim 1, wherein the first flexible base material and the second flexible base material comprise different materials, the first flexible base material having higher flexibility than the second flexible base material.

3. The flexible wiring board according to claim 1, wherein the second flexible base material comprises a plurality of flexible sheets laminated to one another.

4. The flexible wiring board according to claim 1, wherein the insulating layer is contoured to an outline of a tip of the first flexible base material and an outline of the second flexible base material.

5. The flexible wiring board according to claim 1, wherein said insulating layer covers at least a portion the first conductor pattern formed on the first surface of the second flexible base material.

6. The flexible wiring board according to claim 1, wherein the insulating layer comprises:
   a first insulating layer which covers surfaces of the first flexible base material and the second flexible base material on a first side which includes said first surface of the second flexible base material; and
   a second insulating layer which covers surfaces of the first flexible base material and the second flexible base material on a second side opposite to the first side and which includes said first surface of the second flexible base material, such that the second insulating layer exposes the at least one portion of the first flexible base material.

7. The flexible wiring board according to claim 1, further comprising: an upper insulating layer formed on the insulating layer;
   an upper conductor pattern formed on the upper insulating layer; and
   an upper via connecting the second conductor pattern on the insulating layer and the upper conductor pattern, wherein the upper via is filled with a plating metal or a conductor paste.

8. The flexible wiring board according to claim 1, further comprising: a first upper insulating layer formed on the insulating layer;
   a first upper conductor pattern formed on the first upper insulating layer;
   a first upper via connecting the second conductor pattern on the insulating layer and the first upper conductor layer;
   a second upper insulating layer formed on the first upper conductor pattern;
   a second upper conductor pattern formed on the second upper insulating layer; and
   a second upper via formed in a portion substantially directly above the first upper via and connecting the first and second upper conductor patterns, wherein the first and second upper vias are each filled with a plating metal or a conductive paste.

9. The flexible wiring board according to claim 1, wherein the second conductor pattern on the insulating layer extends to an end portion of the insulating layer beyond a boundary between the first flexible base material and the second flexible base material.

10. The flexible wiring board according to claim 1, wherein a fourth conductor layer is formed at an edge of the insulating layer on a side of the first flexible base material.

11. The flexible wiring board according to claim 1, wherein:
   the first flexible base material comprises a plurality of connection pads having a pitch wider than a pitch of the conductor patterns formed on the first flexible base material, and
   the pitch of the conductor patterns widens toward the connection pads such that the conductor patterns are electrically connected to respective connection pads.

12. The flexible wiring board according to claim 1, wherein the first flexible base material and the insulating layer are stacked together in a first portion of the first flexible base material, said first portion being wider than a remaining portion of the first flexible base material.

13. The flexible wiring board according to claim 1, wherein a boundary portion between the first flexible base material and the insulating layer is wider than a remaining portion of the first flexible base material.

14. The flexible wiring board according to claim 1, wherein said insulating layer directly contacts said at least one portion of the second conductor pattern formed on the first surface of the second flexible base material.

15. The flexible wiring board according to claim 3, wherein the plurality of flexible sheets comprise a first flexible sheet and a second flexible sheet disposed so as to sandwich a tip of the first flexible base material.

16. The flexible wiring board according to claim 6, further comprising a via formed in the second insulating layer and connecting a third conductor pattern on the second insulating layer and the first conductor pattern on the first flexible base material.

17. The flexible wiring board according to claim 8, wherein an edge of the insulating layer on a side of the first flexible base material protrudes beyond an edge of the upper-layer insulating layer on the side of the first flexible base material.

18. The flexible wiring board according to claim 15, wherein the first flexible sheet and second flexible sheet are each contoured to an outline of the first flexible base material.

19. A flexible wiring board comprising:
   a first flexible base material having a first conductor pattern formed thereon such that side surfaces of the first conductor pattern extend upwardly from the first flexible base material;
   a second flexible base material disposed adjacent to the first flexible base material;
   a first circuit pattern formed on a first surface of the second flexible base material such that side surfaces of the first circuit pattern extend upwardly from the first surface of the second flexible base material;
   a second circuit pattern formed on a second surface of the second flexible base material which opposes the first surface of the second flexible base material;
   a filled via structure provided within said second flexible base material and connecting the first circuit pattern to the second circuit pattern;
   an insulating layer covering the first flexible base material and the second flexible base material, the insulating layer being a heat pressed layer which contacts at least the side surfaces of the first conductor pattern and the side surfaces of the first circuit pattern such that the insulating layer conforms to a shape of the first circuit pattern and the first flexible base material having the first conductor pattern thereon, wherein the insulating layer having an opening exposing at least one portion of the first flexible base material;
   a second conductor pattern formed on the insulating layer; and
   a via formed in the insulating layer and connecting the first conductor pattern of the first flexible base material and the second conductor pattern on the insulating layer, wherein the first flexible base material further comprises a protective layer covering the first conductor pattern of the first flexible base material, and the via formed in the insulating layer comprises a plating layer.

20. The flexible wiring board according to claim 19, wherein the via formed in the insulating layer penetrates the protective layer.

21. The flexible wiring board according to claim 19, wherein the protective layer in the first flexible base material includes an electromagnetic shield layer.

22. The flexible wiring board according to claim 19, wherein the first conductor pattern is formed in the first flexible base material, an insulating film is formed on the first conductor pattern, and an electromagnetic shield layer is formed on the insulating film.

23. The flexible wiring board according to claim 19, wherein said insulating layer directly contacts said at least one portion of the second conductor pattern formed on the first surface of the second flexible base material.

24. The flexible wiring board according to claim 22, wherein the protective layer is formed on the electromagnetic shield layer.

25. The flexible wiring board according to claim 24, wherein the protective layer is in contact with the insulating layer and is formed on the electromagnetic shield layer.

* * * * *